US012770833B2

(12) United States Patent
Dhindsa et al.

(10) Patent No.: US 12,770,833 B2
(45) Date of Patent: Oct. 20, 2026

(54) PLASMA CHAMBER WITH A MULTIPHASE ROTATING GAS CROSS-FLOW AND PERIPHERAL CONDUCTANCE CONTROL RINGS

(71) Applicant: Applied Materials, Inc., Santa Clara, CA (US)

(72) Inventors: Rajinder Dhindsa, Pleasanton, CA (US); Kenneth S. Collins, San Jose, CA (US); Michael R. Rice, Pleasanton, CA (US); James D. Carducci, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 39 days.

(21) Appl. No.: 17/532,915

(22) Filed: Nov. 22, 2021

(65) Prior Publication Data

US 2023/0162950 A1 May 25, 2023

(51) Int. Cl.
*H01J 37/32* (2006.01)
*H10P 14/61* (2026.01)
(Continued)

(52) U.S. Cl.
CPC .. *H01J 37/32449* (2013.01); *H01J 37/32926* (2013.01); *H10P 14/61* (2026.01);
(Continued)

(58) Field of Classification Search
USPC ........................................ 156/345.29, 345.26
See application file for complete search history.

(56) References Cited

U.S. PATENT DOCUMENTS 4,981,722 A * 1/1991 Moller ................ C23C 16/4408 156/345.33
6,806,211 B2 * 10/2004 Shinriki ............ C23C 16/45578 438/785

(Continued)

FOREIGN PATENT DOCUMENTS

JP H08008239 A 1/1996
JP H10074738 A 3/1998

(Continued)

OTHER PUBLICATIONS

International Search Report and Written Opinion for PCT/US2022/047473 dated Mar. 2, 2023, 10 pgs.

(Continued)

*Primary Examiner* — Ram N Kackar
(74) *Attorney, Agent, or Firm* — Schwabe, Williamson & Wyatt, P.C.

(57) ABSTRACT

A plasma treatment chamber comprises one or more sidewalls. A support surface within the one or more sidewalls holds a workpiece. A first gas injector along the one or more sidewalls injects a first gas flow in a first direction generally parallel to and across a surface of the workpiece. A first pump port along the one or more sidewalls generally opposite of the first gas injector pumps out the first gas flow. A second gas injector along the one or more sidewalls injects a second gas flow in a second direction generally parallel to and across the surface of the workpiece. A second pump port along the one or more sidewalls generally opposite of the second gas injector pumps out the second gas flow. Conductance control rings modulate conductance of the pump ports and are located proximate to plasma screens at a top of the pump ports.

11 Claims, 28 Drawing Sheets

(51) Int. Cl.

| | |
|---|---|
| ***H10P 50/28*** | (2026.01) |
| *H10B 41/20* | (2023.01) |
| *H10B 43/20* | (2023.01) |

(52) U.S. Cl.

CPC ............ *H10P 50/283* (2026.01); *H10B 41/20* (2023.02); *H10B 43/20* (2023.02)

(56) References Cited

U.S. PATENT DOCUMENTS

| | | | | |
|---|---|---|---|---|
| 8,746,170 | B2 * | 6/2014 | Orito | H01L 21/68764 156/345.31 |
| 10,636,625 | B2 | 4/2020 | Dhindsa et al. | |
| 2007/0256784 | A1 | 11/2007 | Chandrachood et al. | |
| 2009/0061643 | A1 | 3/2009 | Takeyama et al. | |
| 2012/0031748 | A1 * | 2/2012 | Ishihara | C23C 14/0068 204/298.07 |
| 2015/0060404 | A1 * | 3/2015 | Dhindsa | H01J 37/32633 216/61 |
| 2017/0178979 | A1 * | 6/2017 | Furukawa | H05B 1/0233 |
| 2018/0082826 | A1 * | 3/2018 | Guha | H01J 37/32082 |
| 2018/0142354 | A1 * | 5/2018 | Shoji | H01J 37/32834 |
| 2018/0323041 | A1 * | 11/2018 | Brown | H01J 37/32816 |
| 2020/0335368 | A1 | 10/2020 | Pan et al. | |
| 2020/0381213 | A1 * | 12/2020 | Lian | H01J 37/32477 |
| 2020/0392618 | A1 * | 12/2020 | Kinose | H01L 21/67242 |

FOREIGN PATENT DOCUMENTS

| | | | |
|---|---|---|---|
| JP | 2001110728 | A | 4/2001 |
| JP | 2001196313 | A | 7/2001 |
| JP | 2009182300 | A | 8/2009 |
| JP | 2010186891 | A | 8/2010 |
| JP | 2015043420 | A | 3/2015 |
| JP | 2019537240 | A | 12/2019 |
| KR | 1020170044018 | A | 4/2017 |
| TW | 202028521 | A | 8/2020 |
| WO | 2020069206 | A1 | 4/2020 |

OTHER PUBLICATIONS

International Preliminary Report on Patentability for PCT/US2022/047473 dated Jun. 6, 2024, 7 pgs.

Notice of Reasons for Rejection for Japanese Patent Application No. 2024-529693 dated Apr. 8, 2025, 4 pgs.

Official Letter from Taiwan Patent Application No. 111143538 dated Feb. 18, 2025, 19 pgs.

Notice to File a Response ("preliminary rejection") from Korean Patent Application No. 10-2024-7020458 dated Apr. 26, 2025, 6 pgs.

Written Opinion and Search Report from Singapore Patent Application No. 11202403163T dated May 1, 2026, 9 pages.

Extended European Search Report from European Patent Application No. 22896306.2, dated Sep. 10, 2025, 9 pages.

* cited by examiner

3-Phase Cross-flow Operation 0 deg 60 deg 120 deg 360 deg

PLASMA CHAMBER WITH A MULTIPHASE ROTATING GAS CROSS-FLOW AND PERIPHERAL CONDUCTANCE CONTROL RINGS

CROSS-REFERENCE TO RELATED APPLICATION

This application is related to co-pending patent application Ser. No. 17/023,186, filed Sep. 16, 2020, assigned to the assignee of the present application, and incorporated herein by reference.

FIELD

Embodiments of the present disclosure pertain to the field of semiconductor processing and, in particular, to a plasma chamber with a multiphase rotating gas cross-flow and peripheral conductance control rings.

DESCRIPTION OF RELATED ART

During a plasma etch, deposition or other treatment processes, a workpiece, such as a semiconductor wafer, is inserted to a sealed plasma reactor chamber, and gas is injected into the chamber over the wafer and then pumped from the chamber. Plasma chambers often comprise (1) a parallel plate capacitively coupled plasma (CCP) source where one electrode has the workpiece on its plasma-facing surface and the other electrode has an array of gas inlet holes (showerhead) in the plasma-facing surface or (2) an inductively coupled plasma (ICP) or microwave source with a radio-frequency (RF) window generally opposite and facing the workpiece, and an array of gas inlet holes in or near the window.

With the axisymmetric gas flow approach described above, pressure & concentration gradients cause center-to-edge processing differences on the workpiece. In addition, extraneous plasma may form in gas inlet holes due to proximity to dense plasma or breakdown due to high electric fields, leading to non-uniformity changing overtime. More specifically, the gas inlet holes are typically formed in a plate of material, such as silicon or silicon carbide. Energetic ions bombarding the edges of the holes can deform or facet the holes overtime. The deformed holes, in turn, result in higher intensity plasma that disrupts the plate, requiring a change in showerheads after some number of hours (e.g., 600 hrs.). In some applications, approximately $15 of a semiconductor wafer cost may be allocated just to the costs of the showerheads.

SUMMARY

Embodiments disclosed herein include a plasma treatment chamber, comprising one or more sidewalls. A support surface within the one or more sidewalls holds a workpiece. A first gas injector along the one or more sidewalls injects a first gas flow in a first direction generally parallel to and across a surface of the workpiece, and a first pump port along the one or more sidewalls generally opposite of the first gas injector pumps out the first gas flow. A second gas injector along the one or more sidewalls injects a second gas flow in a second direction generally parallel to and across the surface of the workpiece, and a second pump port along the one or more sidewalls generally opposite of the second gas injector pumps out the second gas flow. One or more conductance control rings modulate conductance of the first and second pump ports, and located proximate to first and second plasma screens at a top of the first and second pump ports, respectively.

Embodiments disclosed herein include a method of performing a rotating gas cross-flow in a plasma treatment chamber and a non-transitory computer readable medium having stored thereon software instructions that, when executed by a processor, cause the processor to rotate gas cross-flow in a plasma treatment chamber, by executing the following steps. During a first phase the steps include, injecting, by a first gas injector, a first gas flow in a first direction generally parallel to and across a surface of a device, and pumping out, by a first pump port, the first gas flow from the plasma treatment chamber, wherein the first gas injector is along one or more sidewalls of the plasma treatment chamber at a first location, and the first pump port is along the one or more sidewalls at a second location generally opposing the first gas injector. During a second phase the steps include, injecting, by a second gas injector, a second gas flow in a second direction generally parallel to and across the surface of the device, and pumping out, by a second pump port, the second gas flow from the plasma treatment chamber, wherein the second gas injector is along the one or more sidewalls at a third location, and the second pump port is along the one or more sidewalls at a fourth location generally opposing the second gas injector. One or more conductance control rings modulate conductance of the first and second pump ports, and located proximate to first and second plasma screens at a top of the first and second pump ports, respectively.

Embodiments disclosed herein include a plasma treatment chamber, comprising one or more sidewalls. A support is within the one or more sidewalls to hold a workpiece. A first gas injector is along the one or more sidewalls at a first location, and a first pump port is along the one or more sidewalls at a second location generally opposing the first gas injector. A second gas injector is along the one or more sidewalls at a third location, and second pump port is along the one or more sidewalls at a fourth location generally opposing the second gas injector. A multiphase rotating cross-flow operation comprises at least a first phase and a second phase. The first phase comprises injecting, by the first gas injector, a first gas flow in a first direction generally parallel to and across a surface of the workpiece, and pumping out, by the first pump port, the first gas flow. The second phase comprises injecting, by the second gas injector, a second gas flow in a second direction generally parallel to and across the surface of the workpiece, and pumping out, by the second pump port, the second gas flow. One or more conductance control rings modulate conductance of the first and second pump ports, and located proximate to first and second plasma screens at a top of the first and second pump ports, respectively.

DETAILED DESCRIPTION

Figure 1A:
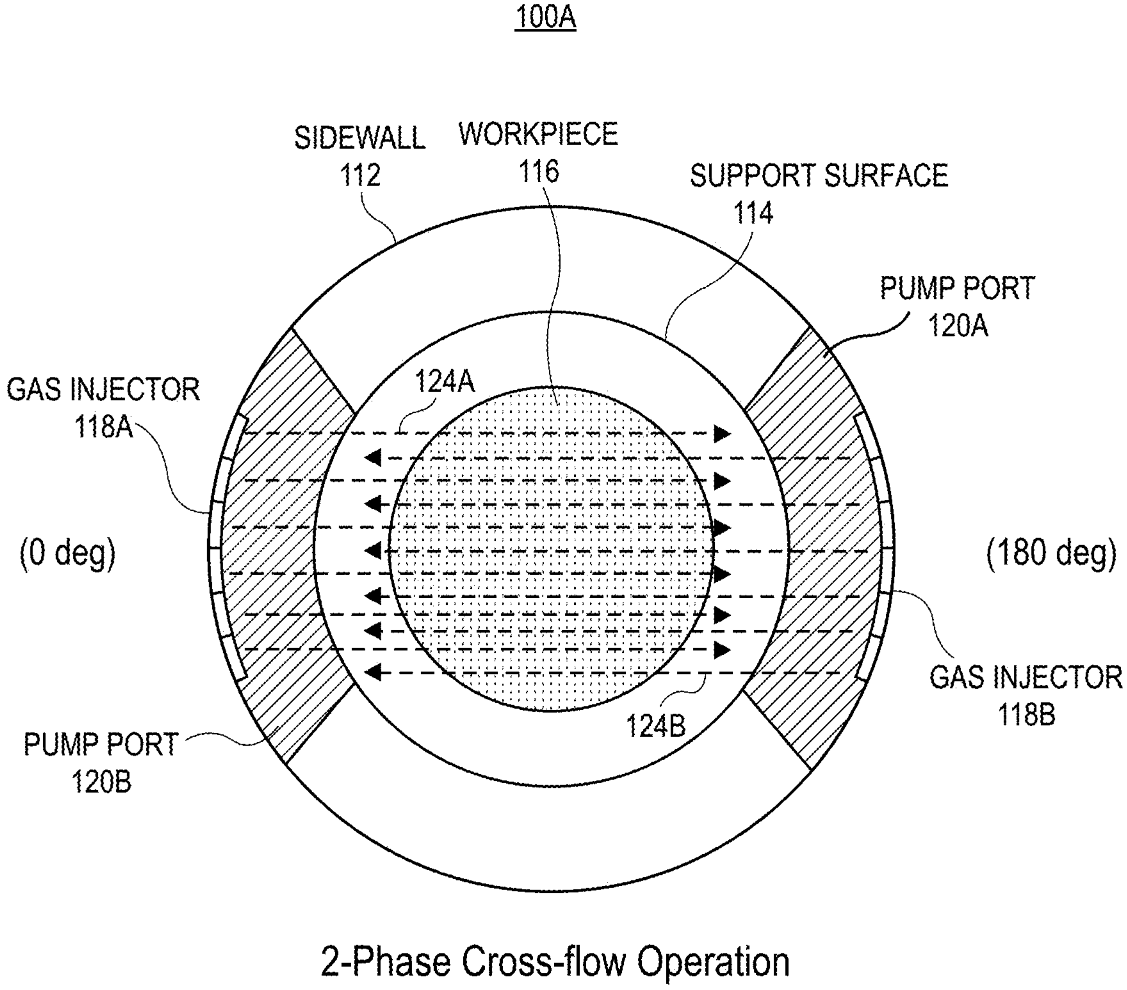
FIG. 1A is a diagram illustrating a top view of the plasma treatment chamber having a multiphase rotating crossflow operation according to one embodiment.

The disclosed embodiments relate to a plasma chamber with a multiphase rotating gas cross-flow and peripheral conductance control rings. In the following description, numerous specific details are set forth, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

Traditional plasma chambers (i.e., CCP or ICP) typically inject gas axisymmetrically over a workpiece from gas inlet holes that are typically located directly above the workpiece or symmetrically around its periphery. As noted above, axisymmetric gas flow can result in pressure and concentration gradients and the gas hole inlets may breakdown, creating non-uniformities in the workpiece. That is, as wear occurs in gas holes in the dense, high |E| plasma regions, geometry of the holes change and as plasma penetrates, the holes may modify the local plasma characteristics in the vicinity of the holes. In addition, the local gas flow rate and velocity may change as a result of geometric changes. Therefore, the showerheads need to be replaced relatively often, increasing cost of the workpiece.

Accordingly, embodiments disclosed herein are directed to a plasma chamber (e.g., CCP or ICP) with a multiphase rotating modulated gas cross-flow for etching, deposition or other materials treatment. The plasma treatment chamber includes two or more gas injectors and two or more pump ports along a sidewall. In a first phase, one of the gas injectors forces a gas flow in one direction generally parallel and across a surface of a workpiece or device, where the gas is then pumped out via a pump port. In a second phase, gas flow is rotated by using another gas injector to force the gas flow in a different direction generally parallel and across the surface of the workpiece, where the gas is then pumped out via another pump port. In another embodiment, gas inlet valves coupled to the gas injector and/or throttle valves coupled to the pump ports can be used to modulate the rotating gas flows.

The plasma treatment chamber with rotating modulated gas cross-flow eliminates the need for showerheads (and gas inlet holes) in the dense, high |E| plasma regions, and therefore prevents the source of plasma non-uniformity. The disclosed embodiments prevent plasma from forming in gas holes due to proximity to dense plasma or breakdown due to high electric fields, leading to non-uniformity and plasma characteristics changing over time. The disclosed embodiments avoid high center-to-edge pressure and concentration gradients that cause center-to-edge processing differences. Pressure distribution can be tailored across the plasma volume to minimize plasma non-uniformity. In addition, the disclosed embodiments eliminate stagnant low-gas velocity regions (i.e., center of the workpiece) for uniform reactant and byproduct removal.

Figure 1B:
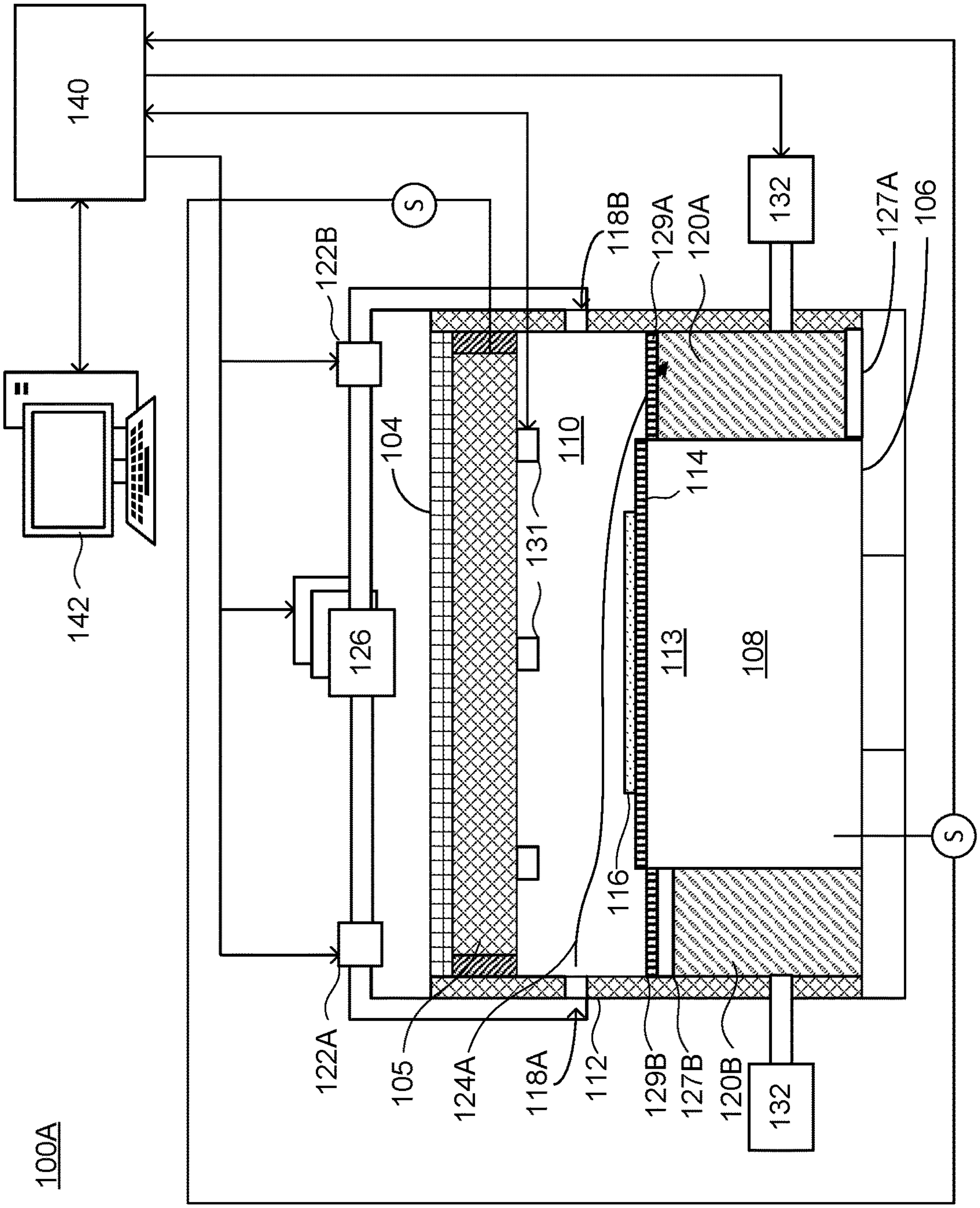
FIGS. 1B and 1C illustrate cross-section views of the plasma treatment chamber in different embodiments.
Figure 1C:
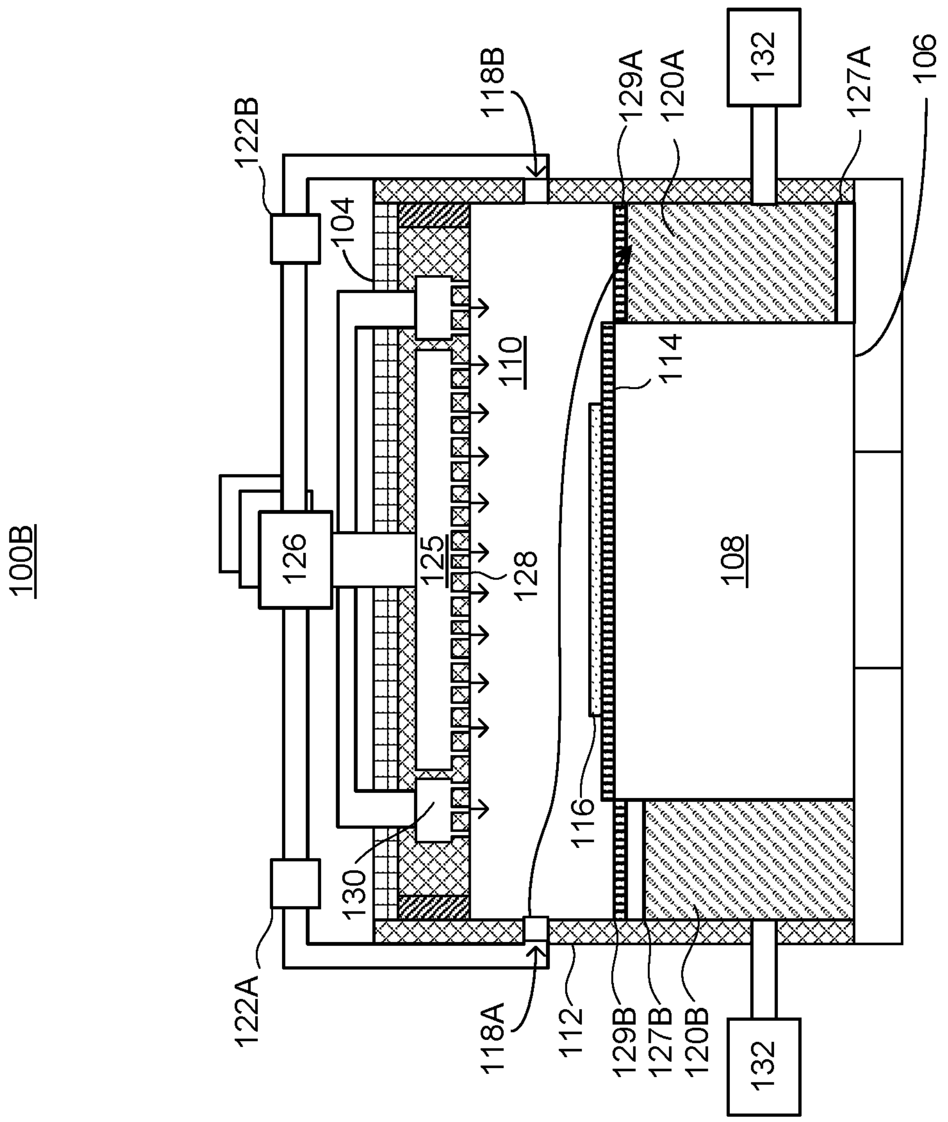

FIGS. 1A-1C are diagrams illustrating embodiments of a plasma treatment chamber of a plasma reactor having a multiphase rotating crossflow operation. FIG. 1A is a diagram illustrating a top view of the plasma treatment chamber having a multiphase rotating cross-flow operation according to one embodiment. FIGS. 1B and 1C illustrate cross-section views of the plasma treatment chamber in different embodiments.

Referring to both FIGS. 1A and 1B, the plasma treatment chamber 100A comprises one or more chamber sidewalls 112 with a support surface 114 therein to hold a workpiece 116 (e.g., a semiconductor wafer) for treatment. The plasma treatment chamber 100 may be used to perform a variety of treatments to the workpiece 116, such as etching, deposition, surface treatment or material modification, by distributing gases inside the chamber. For example, plasma treatment chamber 100A may comprise, but is not limited to, a plasma etch chamber, a plasma enhanced chemical vapor deposition chamber, a physical vapor deposition chamber, an ion implantation chamber, an atomic layer deposition (ALD) chamber, an atomic layer etch (ALE) chamber, or other suitable vacuum processing chamber to fabricate various devices.

In one embodiment shown, the one or more sidewalls 112 surround a processing region 110 in which the workpiece 116 (e.g., wafer or substrate) is treated. In the example shown, the plasma treatment chamber 100A is shown with an axially symmetrical shape (e.g., a cylindrical) resulting in a single cylindrical sidewall 112. However, in other embodiments, the plasma treatment chamber 100A may have any other shape, such as an oval, which also results in a single sidewall 112, or as a square or rectangle, in which case the plasma treatment chamber 100A would have four sidewalls.

According to the disclosed embodiments, the plasma treatment chamber 100 includes at least two gas injectors 118A and 118B (collectively referred to as gas injectors 118) and at least two pump ports 120A and 120B (collectively referred to as pump ports 120) located generally along the sidewall(s) 112. In one embodiment, the gas injectors are formed in the openings through a liner of the sidewall 112. The plasma treatment chamber 100A may be configured to use the gas injectors 118 and the pump ports 120 to rotate gas flows 124 laterally across the workpiece 116 to provide a multiphase rotating cross-flow operation. In one embodiment, the multiphase rotating crossflow operation comprises at least a 2-phase cycle, and may comprise a 3-phase cycle, a 4-phase cycle, and so on, wherein each phase gas is injected from one side of plasma treatment chamber 100A and pumped out generally from an opposite side. As used herein, the phrase "located generally along the sidewall(s)" is intended to describe that any of the gas injectors 118 and/or pump ports 120 may be located in a sidewall or horizontally abutting or adjacent to the sidewall, or located in an outer periphery region of the chamber lid or an outer periphery region of the chamber bottom.

Rotation of gas flow laterally across the workpiece 116 may result in improved control of gas velocity and pressure gradients leading to better process uniformity across a wafer and from wafer-to-wafer.

Referring to FIG. 1B, the plasma treatment chamber 100A further includes a chamber lid 104 over the sidewall 112. A support pedestal 108 may include a support surface 114 on which the workpiece 116 is placed. In embodiments, the support pedestal 108 and the support surface 114 are fixed and not rotatable, and the workpiece 116 affixed thereto is not rotated during processing. In an embodiment, the workpiece 116 is electrostatically affixed to the support surface 114. In another embodiment, the support surface 114 is moveable in the axial direction for plasma gap adjustment or wafer transfer. A processing region 110 in the plasma treatment chamber 100A is defined by an area between the chamber lid 104, the support pedestal 108 (and support surface 114), and the sidewall 112. A chamber floor 106 is beneath the sidewall 112, and the chamber floor 106 is below the processing region 110. The support pedestal 108 is below the chamber lid 104 and above the chamber floor 106, and is surrounded by the sidewall 112. In embodiments, the chamber lid 104 and the support surface 114 may be separated by distance of approximately 25 mm-200 mm. In an embodiment, the plasma treatment chamber 100A is a parallel plate capacitively coupled plasma (CCP) process chamber where a top electrode 105 is above the workpiece 116. A bottom electrode is included in a location 113 in support pedestal 108 below the support surface 114. In one embodiment, the top electrode 105 is coupled to an RF source having a frequency in a range of 40-200 MHz with a power in a range of 200-10,000 Watts. In one embodiment, the bottom electrode is coupled to ground. A plasma is generated above the wafer and between the two electrodes. In an embodiment, the workpiece 116 is electrostatically clamped to the support surface 114 by one or more clamping electrodes in or below the support surface 114. In embodiments, the workpiece 116 is coupled to biasing electrodes (e.g., at a low RF frequency in a range of 0.1 to 20 MHz) for additional plasma control during processing. The generated plasma may be pulsed during processing by pulsing the power to the first electrode 105.

In an embodiment, the workpiece 116 may comprise any substrate that is commonly used in semiconductor manufacturing environments. For example, the workpiece may comprise a semiconductor wafer. In an embodiment, semiconductor materials may comprise, but are not limited to, silicon or III-V semiconductor materials. The semiconductor wafer may be a semiconductor-on-insulator (SOI) substrate in some embodiments. Typically, semiconductor wafers have standard dimensions, (e.g., 200 mm, 300 mm, 450 mm, or the like). However it is to be appreciated that the workpiece 116 may have any dimension. Embodiments may also include workpieces that comprise non-semiconductor materials, such as glass or ceramic materials. In an embodiment, the workpiece 116 may comprise circuitry or other structures manufactured using semiconductor processing equipment. In yet another embodiment, the workpiece 116 may comprise a reticle or other lithography mask object.

FIGS. 1A and 1B illustrate an example of 2-phase cycle rotating cross-flow operation. In the first phase, gas injector 118A injects a first gas flow 124A in a first direction generally parallel to and across a surface of the workpiece 116 and has an opposing pump port 120A along the one or more sidewalls 112 generally opposite of the gas injector 118A to pump out the gas flow 124A. In the second phase, gas injector 118B injects a second gas flow 124B in a second direction generally parallel to and across a surface of the workpiece 116 and has an opposing pump port 120B along the one or more sidewalls 112 generally opposite of the gas injector 118B to pump out the gas flow 124B. In embodiments, the direction of the second gas flow 124B is different from the direction of the first gas flow 124A. In one embodiment, generally parallel means within approximately 0° to 15°, and generally opposite means within approximately 0° to 30°.

Thus, gas injector 118A and the opposing pump port 120A form one gas injector-pump port pair, while gas injector 118B and opposing pump port 120B form a second gas injector-pump port pair. In one embodiment, each of the gas injectors 118A and 118B may comprise an array of individual gas injectors, as shown in FIG. 1A. In an alternative embodiment, each of the gas injectors 118A and 118B includes only a single vent gas injector. In some embodiments, gas injector 118A comprises an array of individual gas injectors, and gas injector 118B is a single vent gas injector, or vice versa.

As shown in FIG. 1A, along the horizontal plane, which is generally parallel to the orientation of the workpiece 116, each gas injector-pump port pair (i.e., a gas injector and the opposing pump port) are symmetrically located along the sidewall 112 of the plasma treatment chamber 100A. Any number of gas injectors 118 and pump ports 120 may be provided. In general one gas injector-pump port pair may be offset from an adjacent injector-pump port pair locations by an angle equal to 360 total degrees divided by the number of injector-pump port pairs to ensure equal distribution of the gases. For example, with two injector-pump port pairs, the injector-pump port pairs are offset from one another by 180° (360°/2). With three injector-pump port pairs, the injector-pump port pairs are offset by 120° (FIGS. 2A and 2B), and so on. In some embodiments, as shown, a gas injector span is smaller than a span of the corresponding pump port. In other embodiments, the gas injector span is the same as the span of the corresponding pump port. In other embodiments, the gas injector span is larger than the span of the corresponding pump port. Gas can be injected from gas injector openings of various geometry such as holes, slots, and the like, and different gas injectors can have the same or different geometries and sizes.

While in some embodiments, the number of gas injectors 118 and pump ports 120 is equal, in other embodiments, the number of gas injectors 118 and pump ports 120 may differ. In some embodiments, a single pump port is associated with a corresponding gas injector, as depicted. In other embodiments, an array of pump ports is associated with a corresponding gas injector.

As shown in FIG. 1B, the gas injectors 118 are located in openings in the sidewall 112 in the processing region 110. For example, the openings may be located within a liner of the sidewall 112. In an embodiment, the openings in the sidewall 112 are in a location vertically between the chamber lid 104 and the substrate support pedestal 108. In the embodiment shown, the openings in the sidewall 112 are adjacent to a bottom of the chamber lid 104.

Along the vertical plane, which is generally parallel to the orientation of the support pedestal 108, locations of the pump ports 120 may be vertically offset from locations of the gas injectors 118 by a distance approximately equal to the distance between a bottom of the chamber lid 104 and a top of the support pedestal 108 in one embodiment. In this embodiment, the pump ports 120 may be located in cavities between the sidewall 112 and the support pedestal 108, and above the chamber floor 106. In another embodiment, the pump ports 120 may be located in additional openings in the sidewall 112 anywhere between the chamber lid 104 and the chamber floor 106. In another embodiment, gas can be injected from peripheral regions of the chamber lid, and/or pumped from peripheral regions of the chamber bottom, and over the workpiece processing region and still flow substantially parallel to the workpiece.

As described above, the plasma treatment chamber 100A of the disclosed embodiments injects gas generally parallel and across the workpiece 116. This is in contrast to a typical axisymmetric top-down gas flow injection from a "showerhead" electrode in a CCP source reactor, and in contrast to a radial outward/downward gas injection from a nozzle array near a central axis in an ICP or microwave source reactor. In addition, instead of a pump port or pumping plenum located axisymmetrically around the periphery of the workpiece, in embodiments, gas is preferentially pumped out from a side of a workpiece generally opposite the injection side.

In embodiments, the gas flow 124 of each crossflow phase can be switched on and off to control gas flow rotation. In another embodiment, instead of switching the gas flow 124 on and off, a modulating function may be applied to a flow rate of the gas flows 124 from the gas injectors 118 and/or to an outlet conductance (or pressure) caused by the pump ports 120 to either approximate open/closed states or to ramp between states using a modulating function, such as sinusoidal. As shown in FIG. 1B, a flow rate of one or both of the first and second gas flows 124A and 124B can be modulated using one or more gas inlet valves 122A and 122B (e.g., piezoelectric valves) that are coupled to gas injector 118A and 118B, respectively. In embodiments, the gas inlet valves 122A and 122B are coupled to one or more gas sources 126, such that a single type of gas, or a mixture of different types of gases, may be injected into the processing region 110 during each rotation phase. In one embodiment, a constant total gas flow may be applied by the gas injectors 118 to smoothly and sequentially inject the gas flows across the different sides of the workpiece 116 in a complete cycle, which may then be repeated as necessary.

FIG. 1B further shows plasma screens 129A and 129B located at tops of the pump ports 120A and 120B, respectively. The plasma screens 129A and 129B may be grounded or floating screens located at the top of respective pump ports to help reduce penetration of the plasma further down at the bottom of the chamber. The plasma screens 129A and 129B have a shape (e.g., a ring or a curved rectangle shape) that generally matches the shape of, and covers, the pump ports 120A and 120B.

In addition, in some embodiments one or more of the pump ports 120 may be modulated. For example, pump port conductance (pressure) may be modulated using pressure control valves or peripheral conductance control rings 127A and 127B (described further below) on pump ports 120A and 120B. Also shown is that the pump ports 120A and 120B are coupled to one or more pumps 132 to evacuate the gas. For example, conductance control ring 127A in pump port 120A may be in an open position, while conductance control ring 127B is shown may be in the closed position to expel the first gas flow 124A. The conductance control rings 127A and 127B may be operated smoothly between two states of conductance or pressure, which are then cycled through in a like sequence as the gas injectors 118A and 118B. In the embodiment shown, conductance control rings 127A and 127B may be pressure control valves, such as throttle valves.

In some embodiments, the plasma treatment chamber 100A may further include sensors 131 and systems to monitor process chamber conditions including gas flow, velocity, pressure, temperature and the like, with high sensitivities and real time measurement. Particular embodiments can include capacitive wall sensors, on-chip or off-chip thermal sensors, pressure sensors, and/or integrated sensors (capacitive sensors and thermal sensors) on substrates such as ceramic substrate or glass or silicon or flexible substrates. In some embodiments, the sensors can be distributed throughout the chamber to monitor the chamber conditions at various locations, which then can be correlated to overall process performances such as etch rate, etch non-uniformity, particle generation, process drifting, pressure uniformity, etc. In one embodiment, a plurality or an array of pressure sensors can be distributed throughout the chamber to provide data regarding gas flow (e.g., rotation rates, uniformity, velocity) during processing.

FIG. 1B further shows that the plasma treatment chamber 100A may be connected to a controller 140, which in turn may be connected to a user interface 142. In some embodiments, the controller may be coupled to the gas inlet valves 122, the conductance control rings 127, the gas sources 126, the pump 132 and the sensors 131 to control operation of the plasma treatment chamber 100A. A user may set process parameters and monitor operation of the plasma treatment chamber 100A through the controller 140 from the user interface 142.

The multiphase architecture of the plasma treatment chamber enables many different configuration options. For example, FIG. 1C illustrates a cross-section view of the plasma treatment chamber 100B in an embodiment that includes a top-down gas flow in addition the one or more pairs of gas injectors 118 and pump ports 120 that provide side-to-side gas flows. In this embodiment, chamber lid 104 may be configured with a showerhead plate 128 (the controller and UI of FIG. 1B are not shown for simplicity). The shower head plate 128 may have a central manifold 125 and one or more outer manifolds 130 for distributing gases into the processing region 110 along with gases distributed by the gas injectors 118A and 118B. Using the showerhead plate 128, additional gases may be introduced into the chamber with a vertical velocity component, but injection of gasses from one side by gas injector 118A and pumping out on other side of workpiece 116 by pump port 120A generally results in a horizontal component of gas velocity across much of the workpiece 116. Likewise, while the pump ports 120 may be on the sidewall 112, or on an upper or lower surface of chamber, the pump ports 120 are generally across from the injection side. Therefore, while there may be a component of velocity of exiting gas in the vertical direction, gas velocity is generally horizontal and parallel to the workpiece 116 in the region above workpiece 116.

Figure 2A:
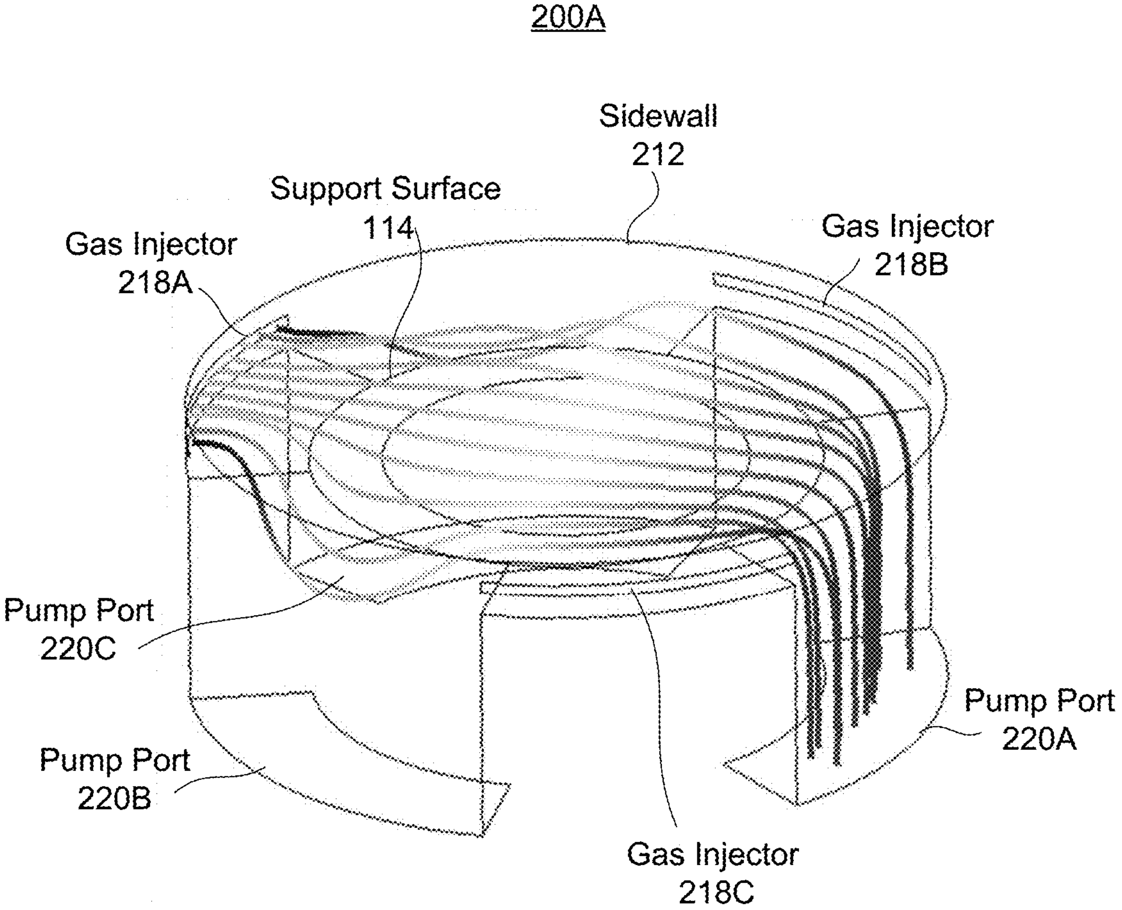
FIG. 2A is a schematic of an angled semi-transparent view of a 3-phase rotating crossflow plasma treatment chamber according to an embodiment.
Figure 2B:
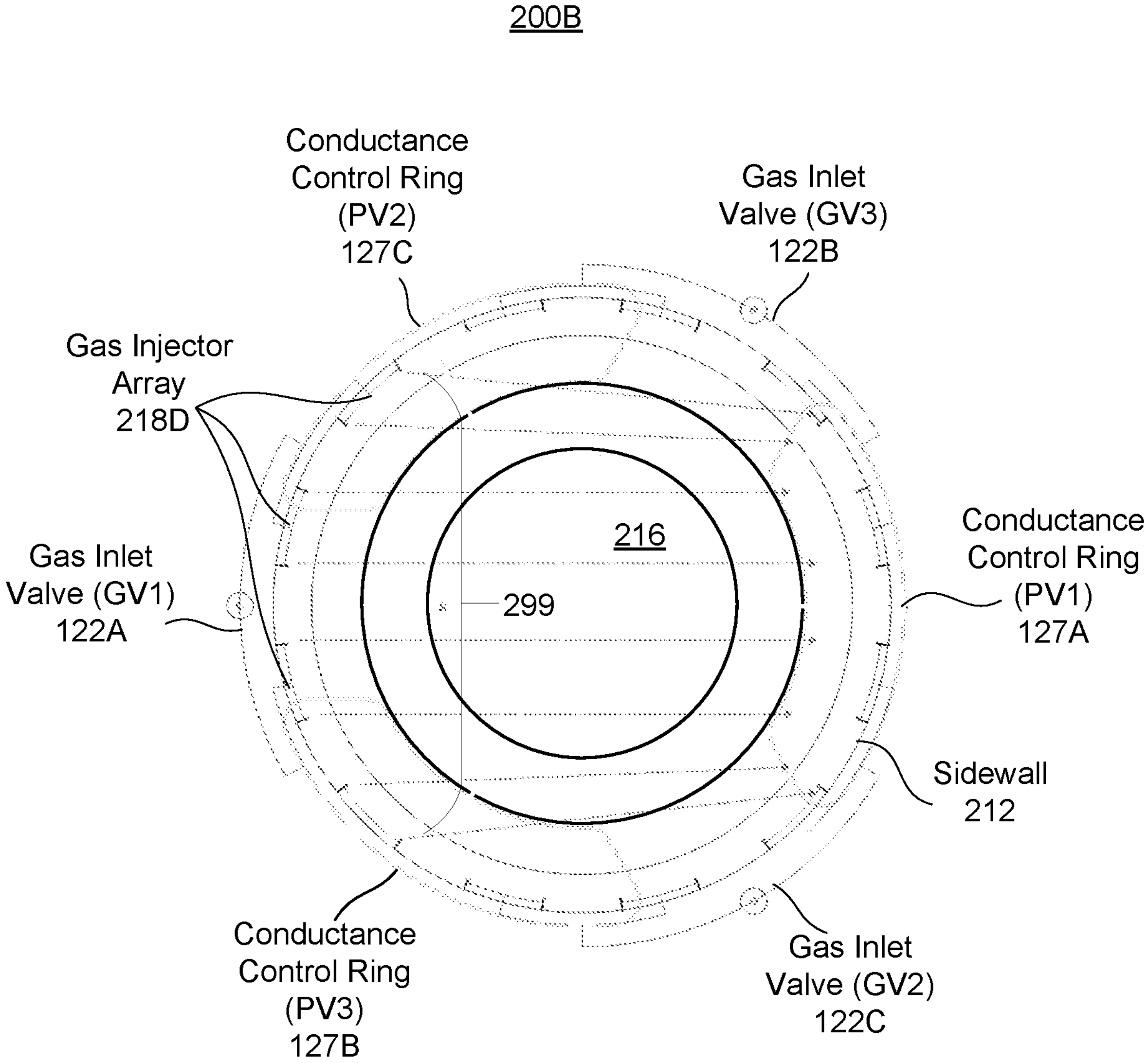
FIG. 2B is a schematic of a top view of the 3-phase rotating crossflow plasma treatment chamber according to another embodiment.
Figure 2C:
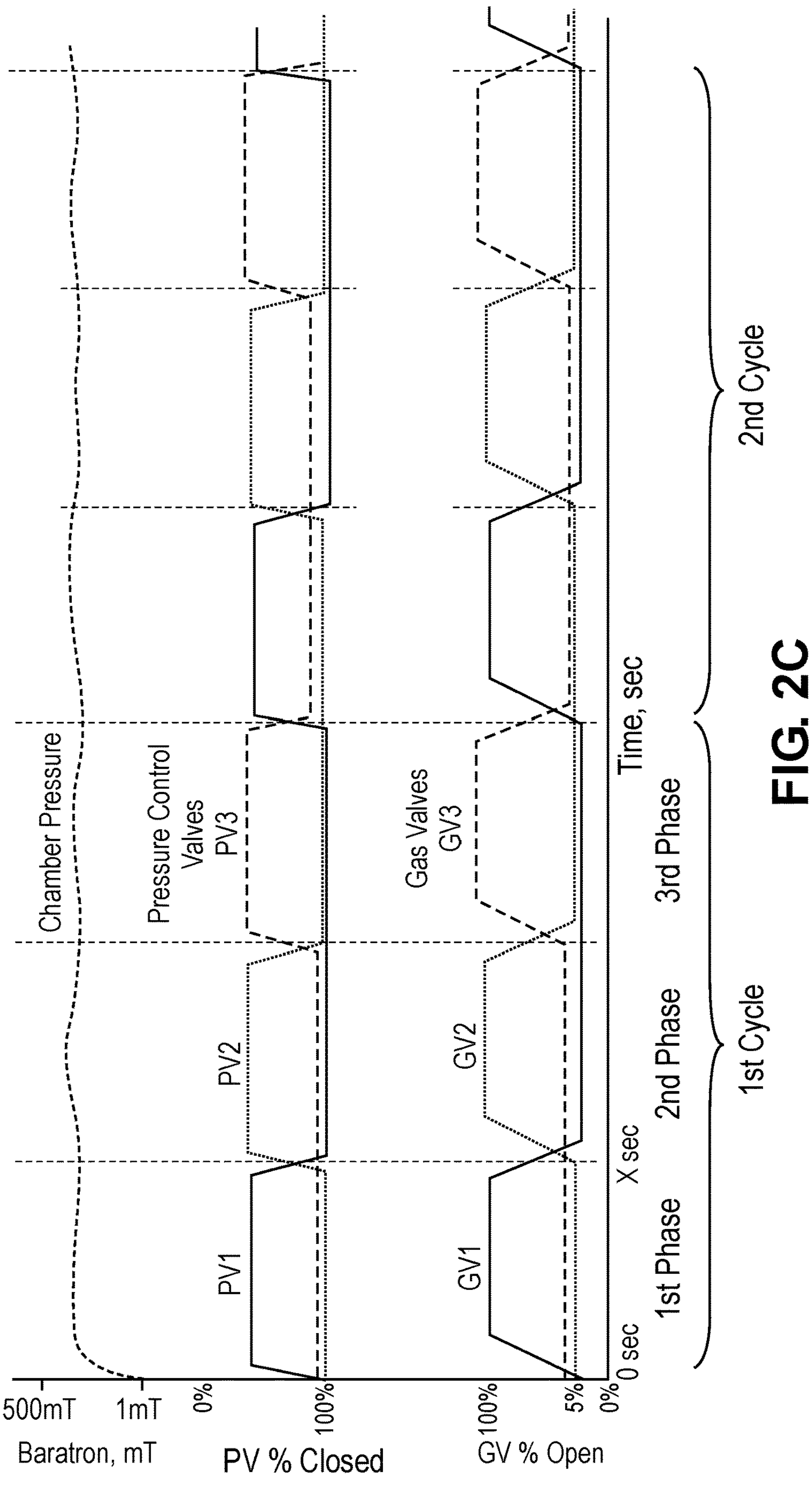
FIG. 2C illustrates a timing diagram for the 3-phase rotating crossflow operation performed by plasma treatment chamber.

FIGS. 2A-2C are diagrams illustrating a plasma treatment chamber of a plasma reactor having a 3-phase rotating cross-flow operation according to one embodiment. FIG. 2A is a schematic of an angled semi-transparent view of the 3-phase rotating crossflow plasma treatment chamber. FIG. 2B is a schematic of a top view of the 3-phase rotating crossflow plasma treatment chamber according to another embodiment.

Referring to FIG. 2A, the plasma treatment chamber 200A having a 3-phase rotating cross-flow operation is similar to the embodiment shown with respect to FIGS. 1A-1C in that the chamber 200 includes a sidewall 212 surrounding a workpiece 216. However, in addition to two gas injectors 218A and 218B and two opposing pump ports 220A and 220B, the plasma treatment chamber 200 further includes gas injector 218C and opposing pump port 220C located on a generally opposite side of the sidewall 212 to pump out the gas flow. Gas injector 218A and the opposing pump port 220A form one gas injector-pump port pair, gas injector 218B and opposing pump port 220B form a second gas injector-pump port pair, and gas injector 218C and opposing pump port 220C form a third gas injector-pump port pair. (Gas injectors 218A-218C are collectively referred to as gas injectors 218, and pump ports 220A-220C are collectively referred to as pump ports 220.)

In this embodiment, the gas injectors 218 each comprise as a single vent in the sidewall 212, as shown. In one embodiment, the gas injectors 218 are symmetrically arranged about the central axis of the plasma treatment chamber 200, and the pump ports 220 are symmetrically arranged about the central axis of the plasma treatment chamber 200, as shown. In the 3-phase rotating cross flow embodiment comprising three injector-pump port pairs, the injector-pump port pairs are offset from one another by 120° (360°/3). More specifically, the gas injectors 218 are located approximately 120° from one another, and the pump ports 220 are located 120° from one another. The pump ports 220 dispersed laterally between the spaced-apart gas injectors 218 as well as vertically offset from the gas injectors 218.

FIG. 2B shows a top view of plasma treatment chamber 200B comprising an array of individual gas injectors, referred to as gas injector array 218D, where the individual gas injectors are distributed about a periphery of the sidewall 212. Also shown are three gas inlet valves 122A-122C, and three conductance control rings 127A-127C, one per pump port 120 (see FIG. 1B). Sets of the smaller gas injectors in the gas injector array 218 (such as four injectors, as shown) may be modulated by a single one of the gas inlet valves 122A-122C to create gas flows in various directions across the workpiece 216. The gas flow is then pumped out by one of the pump ports controlled by a corresponding one of the conductance control rings 127A-127C generally opposite from the modulating gas inlet valves 122A-122C. In this case, in an embodiment, the gas injector span is larger than the span of the corresponding pump port, resulting in a somewhat converging flow (e.g., flow 299) to a relatively narrower pump port.

FIG. 2C illustrates a timing diagram for the 3-phase rotating crossflow operation performed by plasma treatment chamber 200B in further detail. The timing diagram assumes the presence of three gas inlet valves 122 (GV1, GV2, GV3), and the presence of three conductance control rings 127 (PV1, PV2, PV3). The X-axis represents time and the Y-axis represents i) a percentage of gas valve open in the bottom row, a percentage of pump port closed in the middle row, and chamber pressure as measured by a Baratron (manometer) in the top row.

A controller may be coupled to the plasma treatment chamber 200 and configured to control the gas inlet valves 122A-122C and conductance control rings 127A-127C. The controller starts the first phase by substantially opening GV1 from 20-100%, and partially opening GV2 and GV3, for example, at approximately 0-5%. During the first phase, PV1 is opened while PV2 and PV3 are closed, and chamber pressure is between 1 mT and 500 mT.

GV1 begins closing near a transition between the first phase and the second phase, and the direction of the gas flow is rotated by fully opening GV2 from 20-100% to begin the second phase. GV1 and GV3 are partially open at approximately 0-5%. During the second phase, the controller opens PV2 and keeps PV1 and PV3 closed. Chamber pressure may remain between 1 mT and 500 mT in some embodiments, or between 10 mT and 200 mT in other embodiments.

Near a transition between the second phase and the third phase, GV2 is ramped down, and the direction of the gas flow is rotated by opening GV3 to from 20-100% to begin the third phase. GV1 and GV2 are partially open at approximately 0-5%. During the third phase, the controller opens PV3 and keeps PV1 and PV2 closed. This completes the 3-phase cycle, which may be repeated as necessary. As shown, a relatively constant chamber pressure is maintained during the three gas flow phases. In an embodiment, opening and closing GV1, GV2 and GV3 sequentially effectively creates a rotational gas flow, which may mimic rotation of a wafer. In one embodiment, a single full rotation of the gas flow is performed at a rate approximately in a range of 100 ms to 10 sec.

Many different variations between the gas flow phases and cycles may occur. That is each parameter controlling operation of the plasma treatment chamber may vary across phases and cycles. For example, the time to complete a full cycle may be the same or different across different cycles. The time to complete a phase may be the same or different within a cycle, and may be the same or different across different cycles. The direction of gas flow rotation (e.g., clockwise, counterclockwise) may be the same or different within phases of a cycle, may be non-sequential, or may be the same or different across cycles. The velocity of the gas flows may be the same or different within phases of a cycle, or may be the same or different across cycles. The % open of the gas valves and the time the gas valves are open may be the same or different within phases of a cycle, or may be the same or different across cycles. The % open of the conductance control rings and the time the conductance control rings are open may be the same or different within phases of a cycle, or may be the same or different across cycles. For example, in an embodiment, rotation is performed for a first portion of a process at one rate, and is then slowed to a second rate for a second portion of the process. In an embodiment, rotation is performed for a first portion of a process at one rate, and is then sped up to a second rate for a second portion of the process. In an embodiment, rotation is fast for a first portion of a single rotation cycle, and slows for a second portion of the rotation. In an embodiment, rotation is slow for a first portion of a single rotation cycle, and is sped up for a second portion of the rotation. By varying rotation speed within a single cycle, or cycle to cycle, process non-uniformities may be compensated for. In other embodiments, direction is changed between clockwise and counter-clockwise within a cycle, cycle-to-cycle, or between sets of cycles. Likewise, in embodiments, gas flow rates between a first phase, a second phase, and a third phase can be varied within a cycle, cycle-to-cycle, or between sets of cycles.

Figure 2D:
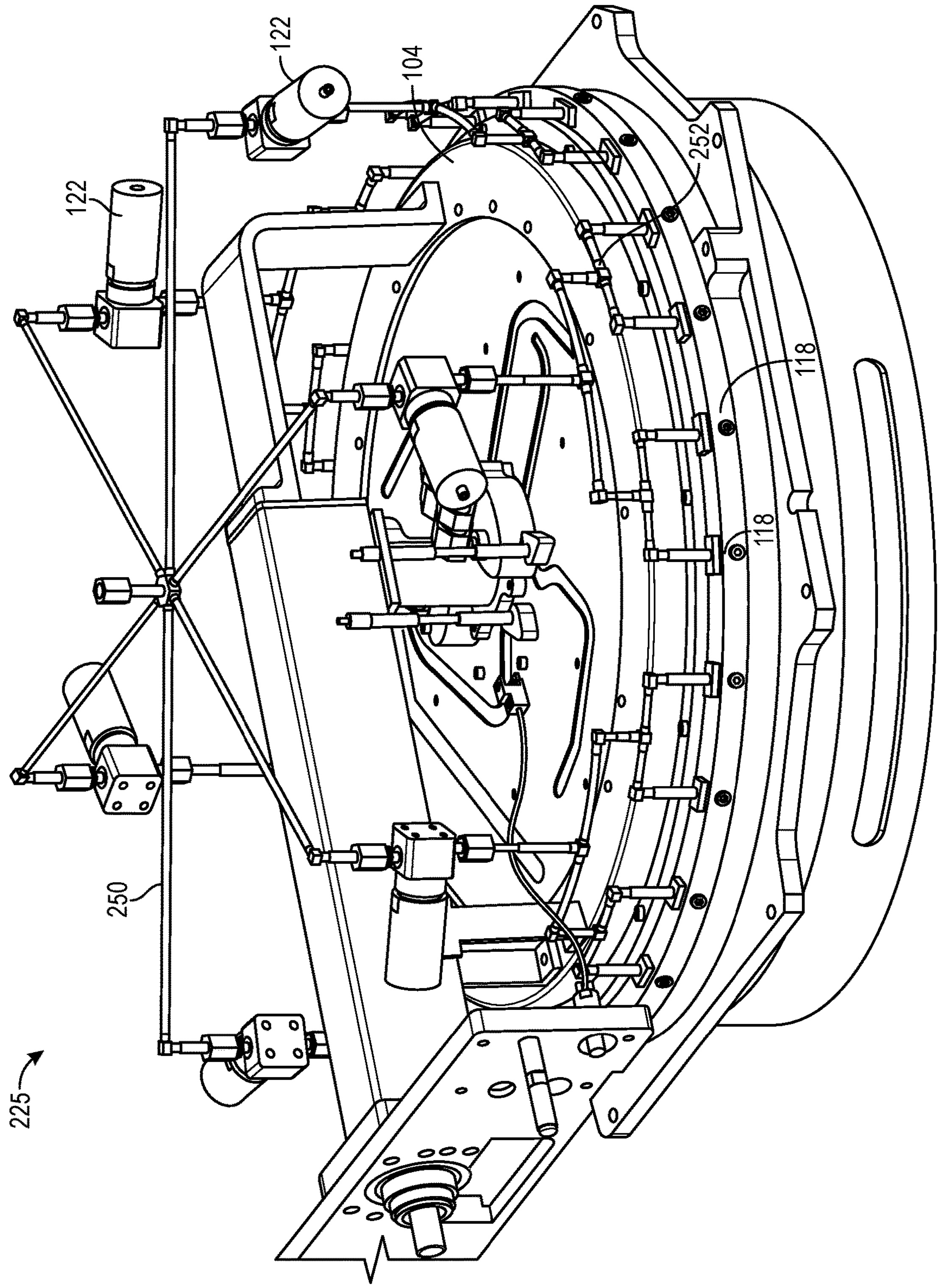
FIG. 2D illustrates an angled view of a top of the chamber lid showing a gas delivery system there above according to an embodiment.

FIG. 2D illustrates an angled view of a top of the chamber lid 104 showing a gas delivery system there above. In one embodiment, the gas delivery system 225 comprises an array of gas inlet valves 122, where each of the gas inlet valves 122 are located above, and symmetrically arranged, around a perimeter of the chamber lid 104. In the embodiment shown, gas delivery system 225 comprises 6 gas inlet valves 122, but the specific number may vary, e.g., two or more. A top side of each of the gas inlet valves 122 may be connected to a gas line assembly 250 arranged in a spoke and hub formation, where the hub is connected to the gas sources 126 shown in FIGS. 1B and 1C. A bottom side of the gas inlet valves 122 may be connected to respective sets of recursive gas lines 252. Each set of recursive gas lines 252 may be coupled to one or more gas injectors 118. In the specific embodiment shown, there are 6 sets of recursive gas lines 252 with 4 inlets each coupled to the gas injectors 118 for a total of 24 inlets.

In embodiments, the gas inlet valves 122 may comprise analog variable conductance fast gas valves that allow fast response without excessive pressure spikes that lead to gas light up or arcing or make it difficult for RF match control to follow. Specific examples of the gas inlet valves include commercially available Swagelok eDE Valves and Fujikin Piezo Valves. The Swagelok eDE Valves may have 15-20 msec open/close times, are good for sealing atm/vacuum, and have a lifespan of 40M cycles. The Fujikin Piezo Valves have a proportional flow, a 10 msec open/close time and may have a lifespan much greater than 40M cycles depending on use. Both may provide gas flows up to 2.5 slm @400T upstream pressure.

Figure 2E:
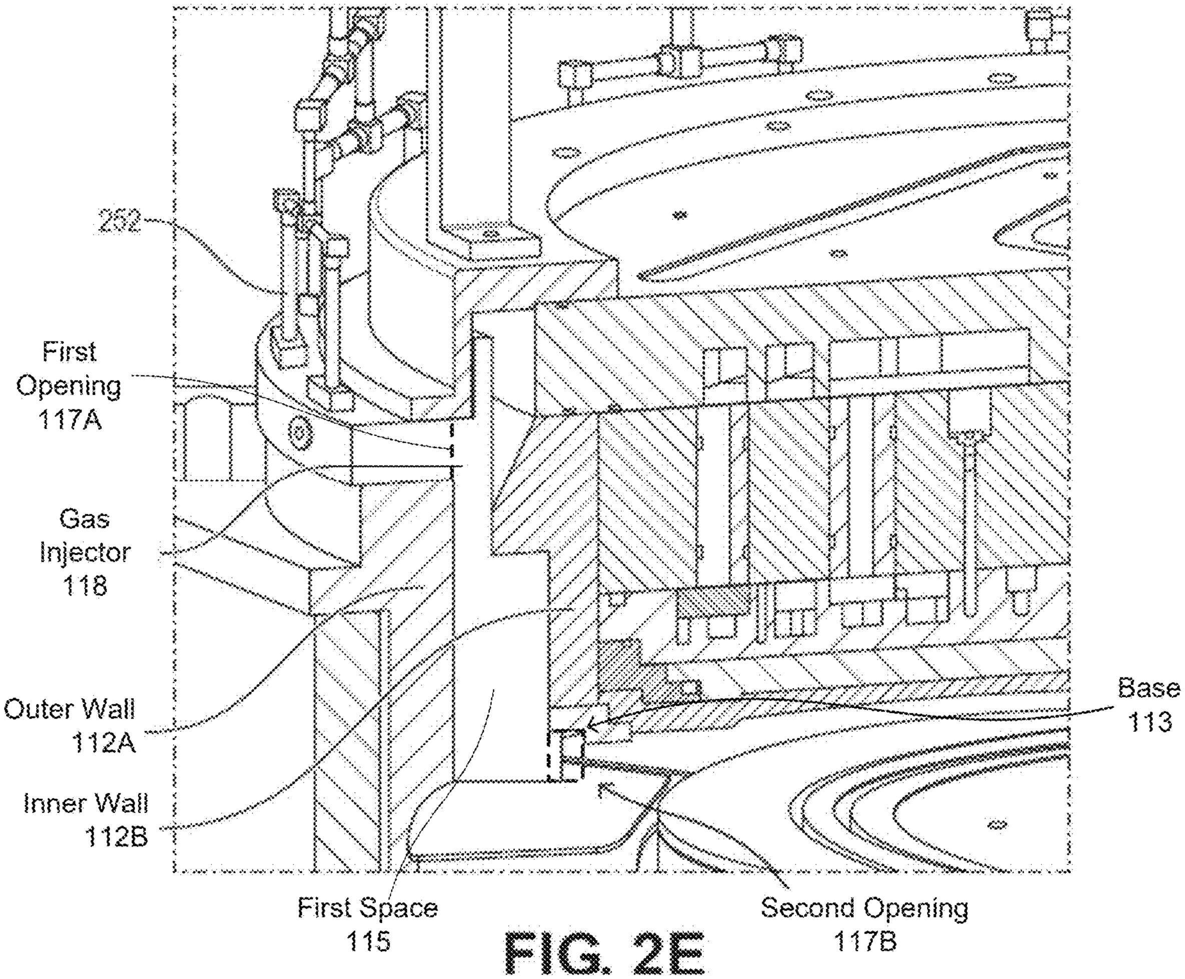
FIG. 2E illustrates an angled cross-section view of the plasma chamber according to an embodiment.
Figure 2F:
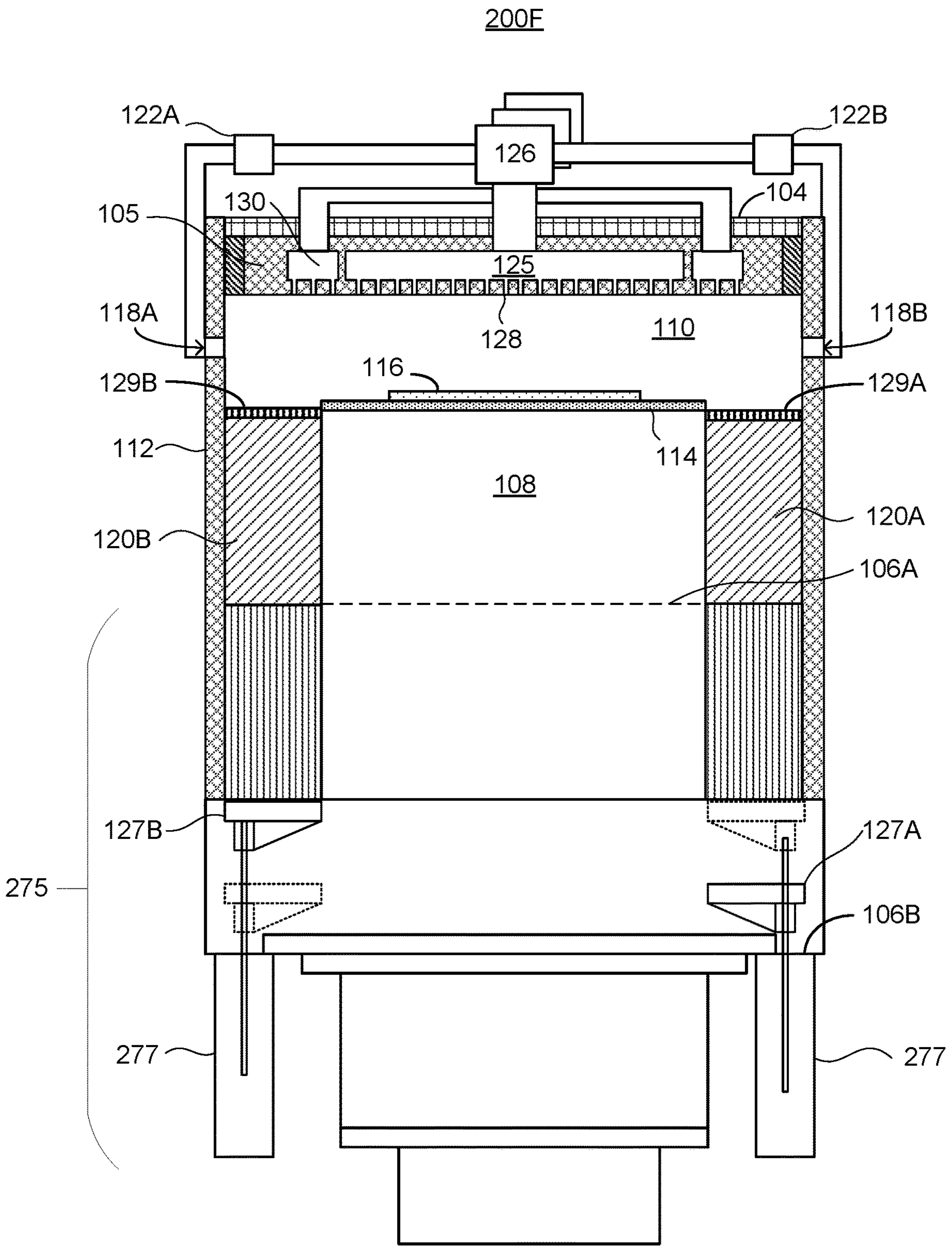
FIG. 2F illustrates a cross-section view of a plasma chamber.
Figure 2G:
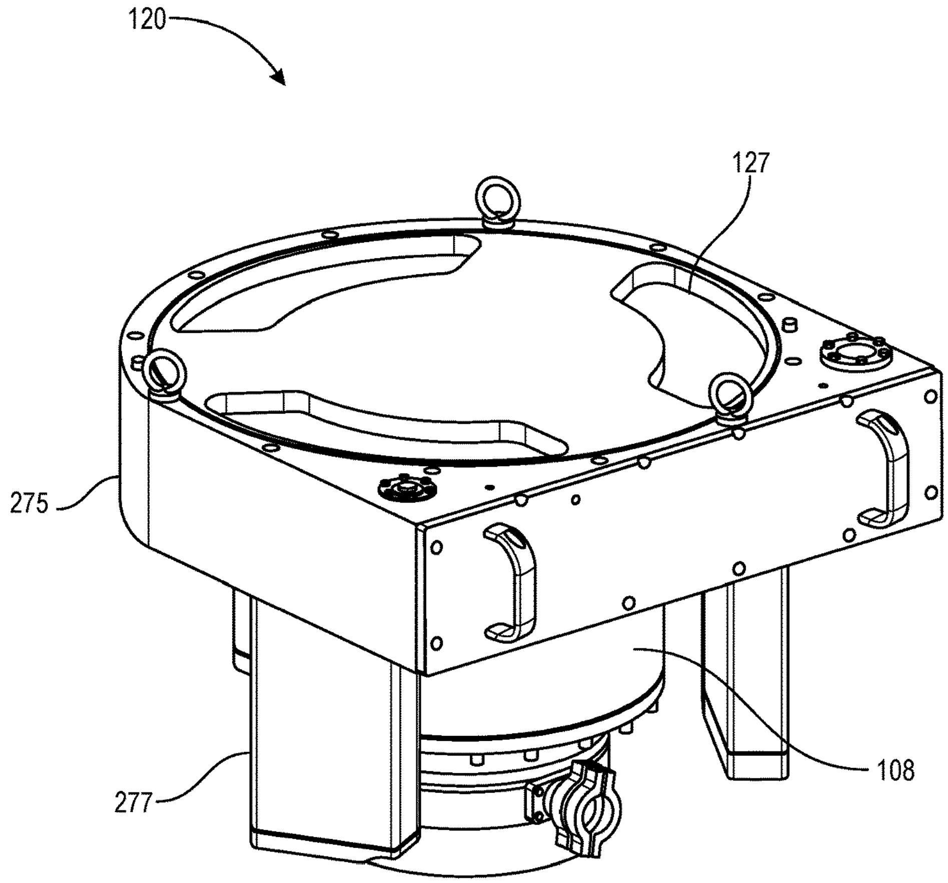
FIGS. 2G-2H illustrate angled views of a vacuum chamber in which the pump ports are formed according to an embodiment.
Figure 2H:
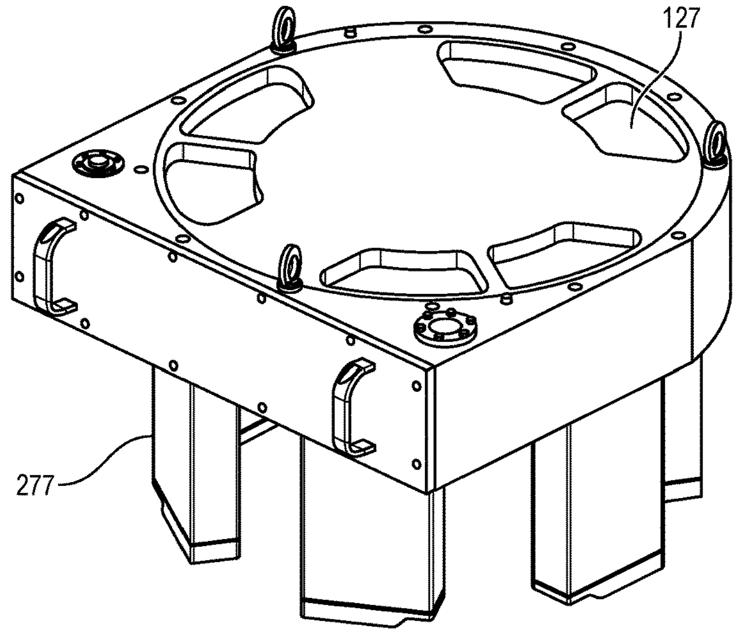

FIG. 2E illustrates an angled cross-section view of the plasma chamber. This view shows the connections between the recursive gas lines 252 and gas injector(s) 118. Also shown is that one embodiment, sidewall 112 may comprise an outer sidewall 112A and an inner sidewall 112B (or liner), and the gas injector(s) 118 are formed in a first space(s) 115 between the outer sidewall 112A and the inner sidewall 112B. The gas injector 118 is connected to a first gas line of the recursive gas lines 252 through a first opening 117A in the outer sidewall 112A to inject the gas from the gas injector(s) 118 through a second opening(s) 117B in the inner sidewall 112B located at a base 119 of the inner sidewall 11B. FIG. 2F illustrates a cross-section view of a plasma chamber 200F, and FIGS. 2G and 2H illustrate angled views of the vacuum chamber 275. The plasma chamber 200F is similar to the embodiment shown in FIG. 1C, but also shows an embodiment of a vacuum chamber 275 in which the pump ports 120 (120A and 120B) may be formed. In embodiments, the vacuum chamber 275 is under dynamic vacuum controlled by pump 132. In one embodiment, the vacuum pressure may range from 1 mT to 500 mT. In one embodiment, the chamber floor 106 comprises an upper chamber floor 106A and a lower chamber floor 106B, and the pump ports 120 are formed within cavities in the vacuum chamber 275 between the upper chamber floor 106A and the lower chamber floor 106B. The pump ports 120 are also shown symmetrically arranged around the support pedestal 108.

Actuators 277 are coupled to the conductance control rings 127 to control each of the pump ports 120. The pump ports 120 are closed and opened by one of the actuators 277 raising and lowering a corresponding conductance control rings 127 within the cavity of each pump port 120. FIG. 2G shows that in one embodiment, the conductance control rings 127 may comprise a single unitary body to seal the associated port, while FIG. 2H shows that in another embodiment, conductance control rings 127 may be divided into one or more adjacent sections (2 in this case), each controlled by a corresponding actuator 277.

In an embodiment, referring to FIG. 2F, 127A on the right is down (OPEN) to pump out gas injected by gas injector 118A, and 127B on the left is up (CLOSED). During a transition from one crossflow phase to another, the conductance control ring 127A moves up to a closed position, while conductance control ring 127B moves down to an open position to pump out the volume of gas or air from both the processing region 110 and pump port 120B, which includes a substantial amount of dead air due to the length of the vacuum chamber 275.

Peripheral Conductance Control Rings

In accordance with another aspect of the disclosed embodiments, the plasma treatment chamber is provided with one or more conductance control rings that are located proximate to both the surface of the processing region 110 and the plasma screens at the top of the pump ports, rather than at the bottom of the vacuum chamber 275. The result is improved plasma confinement and lower gas residence time over the workpiece 116 because less volume of gas or air needs to be pumped out of the processing region.

There are various location and configuration embodiments. For instance, one or more conductance control rings can be located above or below the processing region adjacent to the plasma screens 129 in each of the pump ports 120.

Figure 2I:
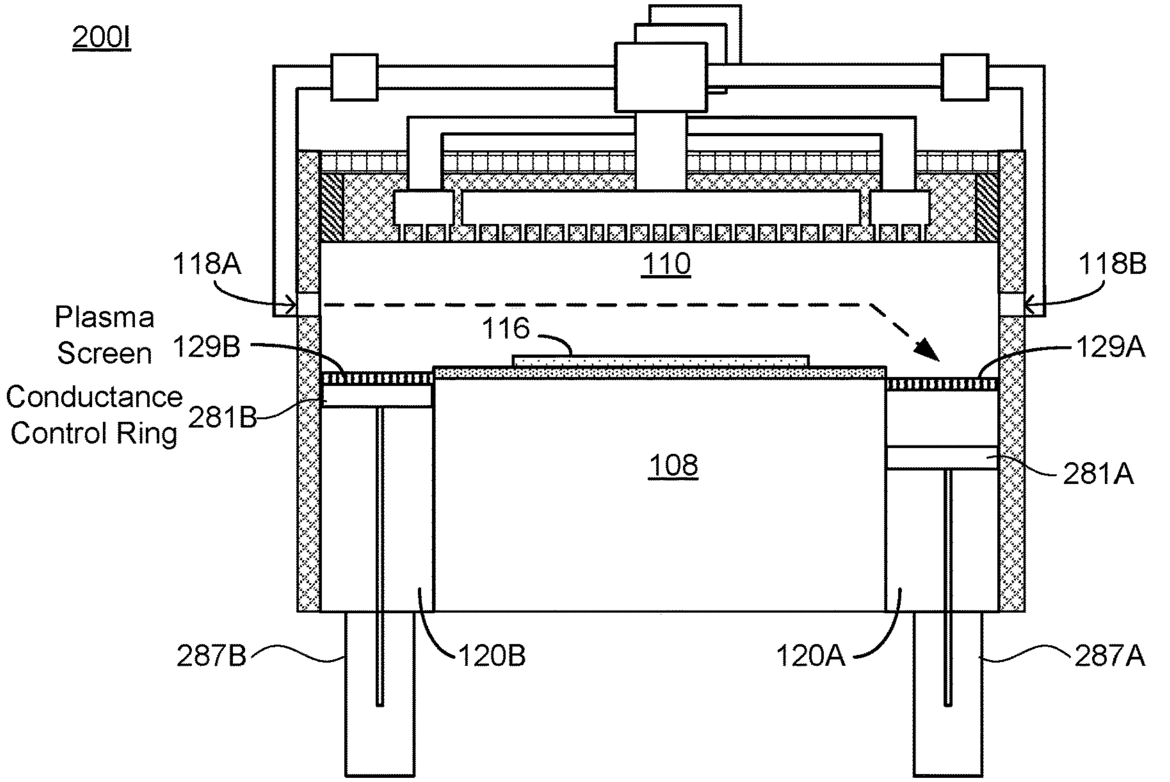
FIGS. 2I and 2J illustrates cross section views of plasma treatment chambers comprising respective conductance control rings for each pump port.
Figure 2J:
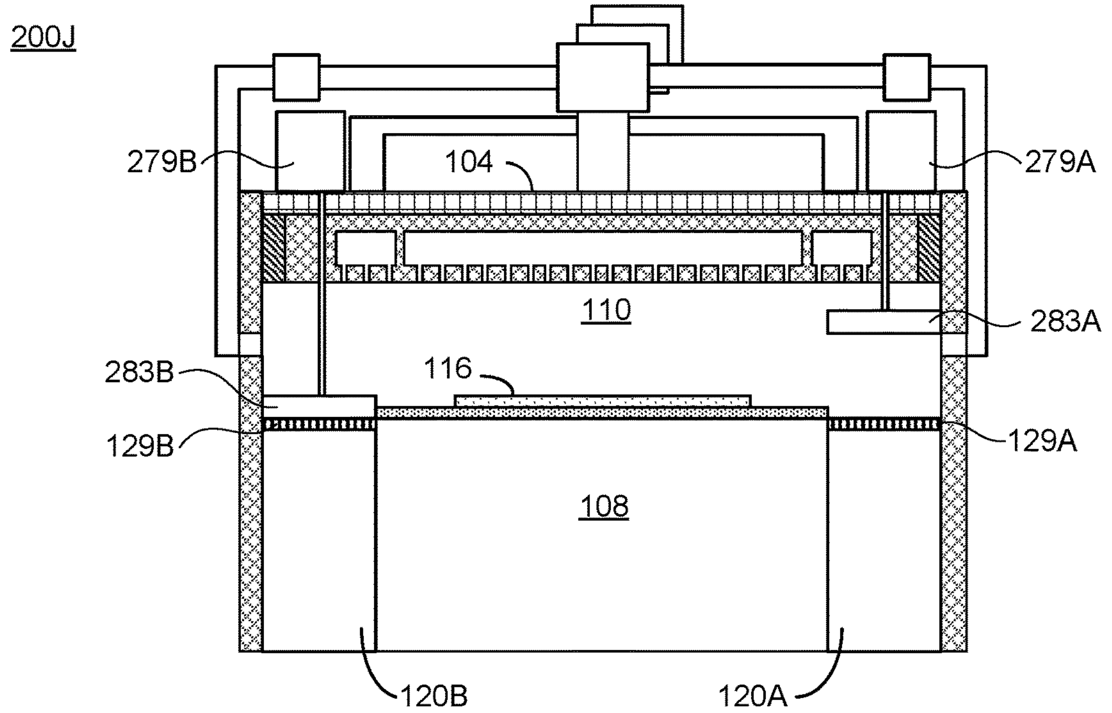

FIGS. 21 and 2J illustrates cross section views of plasma treatment chamber 2001 and 200J comprising respective conductance control rings 281A and 281B for each pump port 120A and 120B, respectively, where the conductance control rings 281 are located directly adjacent to the plasma screens 129 (in the closed position) in each of the pump ports 120A and 120B and move in a vertical direction. For, example, if there are 3x pump ports 120, there can be 3x conductance control rings 281. In this embodiment, a solid conductance control ring 281 is provided for each pump port 120, where the conductance control rings 281 are independently moved vertically up and down to abut the corresponding plasma screen 129A and 129B.

FIG. 2I illustrates the embodiment where conductance control rings 281A and 281B are located beneath the plasma screens 129A and 129B in corresponding pump ports 120A and 120B. Actuators 287A and 287B are located beneath the pump ports 120 and move the conductance control rings 281 vertically up and down to close and open the pump ports 120, respectively. Conductance control ring 281B is shown in the closed position and directly abutting plasma screen 129B.

FIG. 2J illustrates the embodiment where conductance control rings 283A and 283B are located above the plasma screens 129A and 129B in the processing region 110. One or more actuators 279A and 279B are located on or above the chamber lid 104 move the conductance control rings 283A and 283B vertically up and down to open and close the pump ports 120, respectively. Conductance control ring 283B is shown in the closed position and directly abutting plasma screen 129B within processing region 110. In the embodiments of FIGS. 2F-2J, the conductance control rings can comprise a solid plate of a material such as quartz, for example.

Actuators 279 are coupled to controller 140 (FIG. 1B), which synchronizes the movement of the conductance control rings 283A and 283B to the various cross-flow phases. In embodiments, the controller 140 can use machine learning to set and/or control the gas pulse and vertical movement sequence/timing.

Figure 2K:
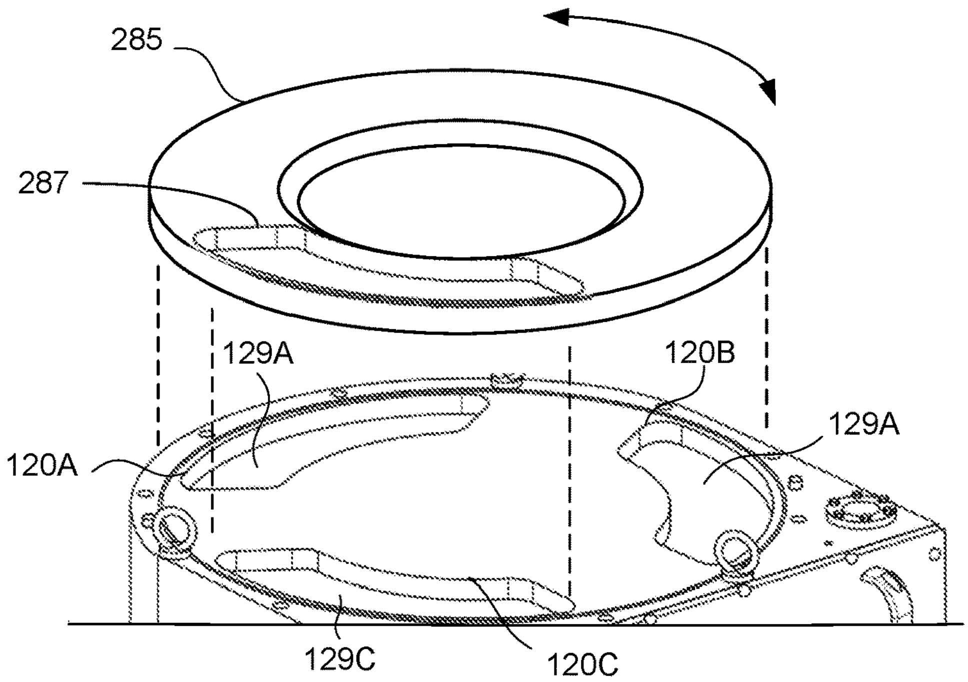
FIGS. 2K and 2L illustrate an embodiment where a single conductance control ring 285 is provided for a multiple pump ports 120.
Figure 2L:
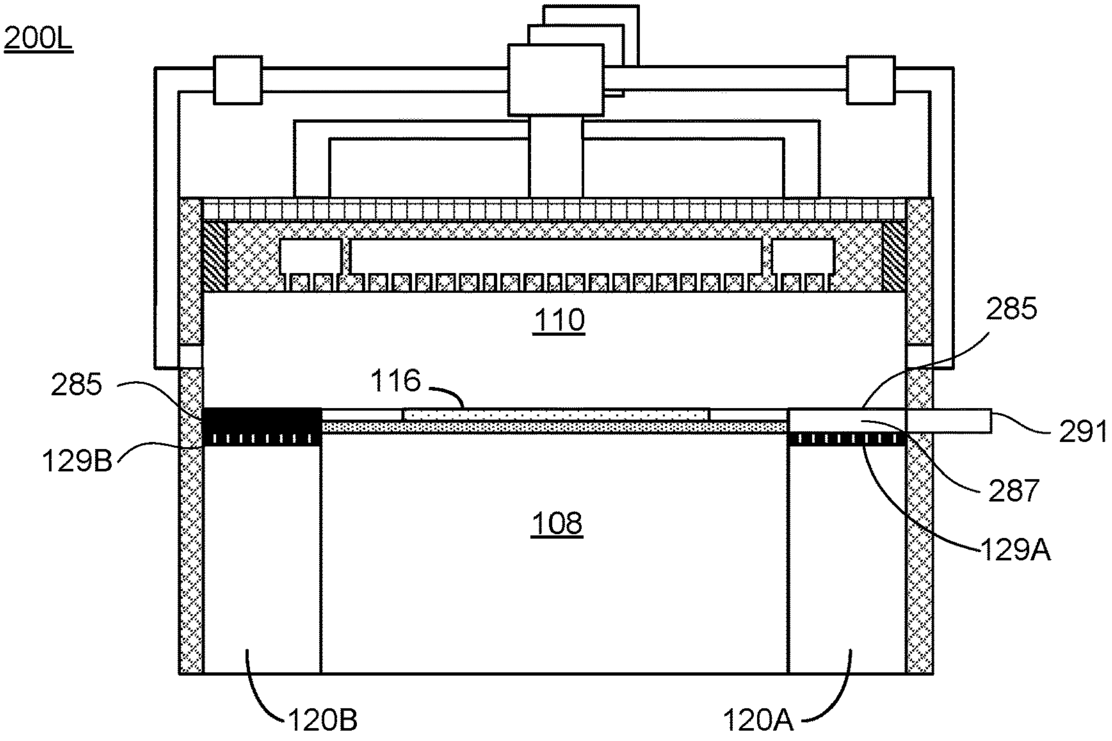

FIGS. 2K and 2L illustrate an embodiment where a single conductance control ring 285 is provided for multiple pump ports 120. FIG. 2K illustrates an angled exploded view of the conductance control ring 285 and the pump ports 120. FIG. 2L illustrates a cross-sectional view of the conductance control ring 285 located inside plasma treatment chamber 200L and over and on the pump ports 120.

FIGS. 2K and 2L show an embodiment where the conductance control ring 285 is located above and directly on the plasma screens 129 (129A, 129B and 129C) in corresponding pump ports 120. The conductance control ring 285 is a disc shape having one or more openings 287, such as one or more slots or a plurality of through holes. The conductance control ring 285 has an outside diameter approximately matching an outside diameter of the processing region 110 and inside diameter approximately matching the diameter of the pedestal 108. In the embodiment shown, the conductance control ring 285 has a single opening 287 sized to match the lateral size of the pump ports 120, and can be rotated (shown by the arrow) so that the opening 287 aligns with a currently active pump port 120.

Figure 2M:
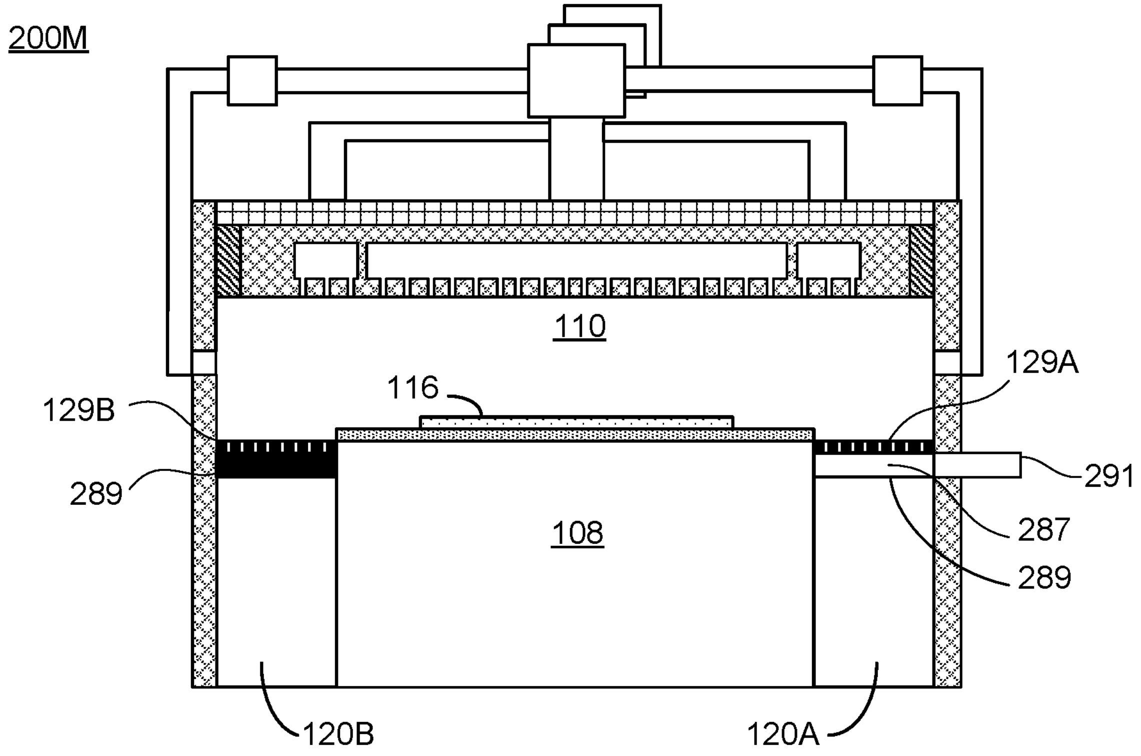
FIG. 2M illustrates a cross section view of plasma treatment chamber in an embodiment where the conductance control ring is located directly below and abutting the plasm screens.

FIG. 2M illustrates a cross section view of plasma treatment chamber 200M in an embodiment where the conductance control ring 285 is located directly below and abutting the plasm screens 129.

Figure 2N:
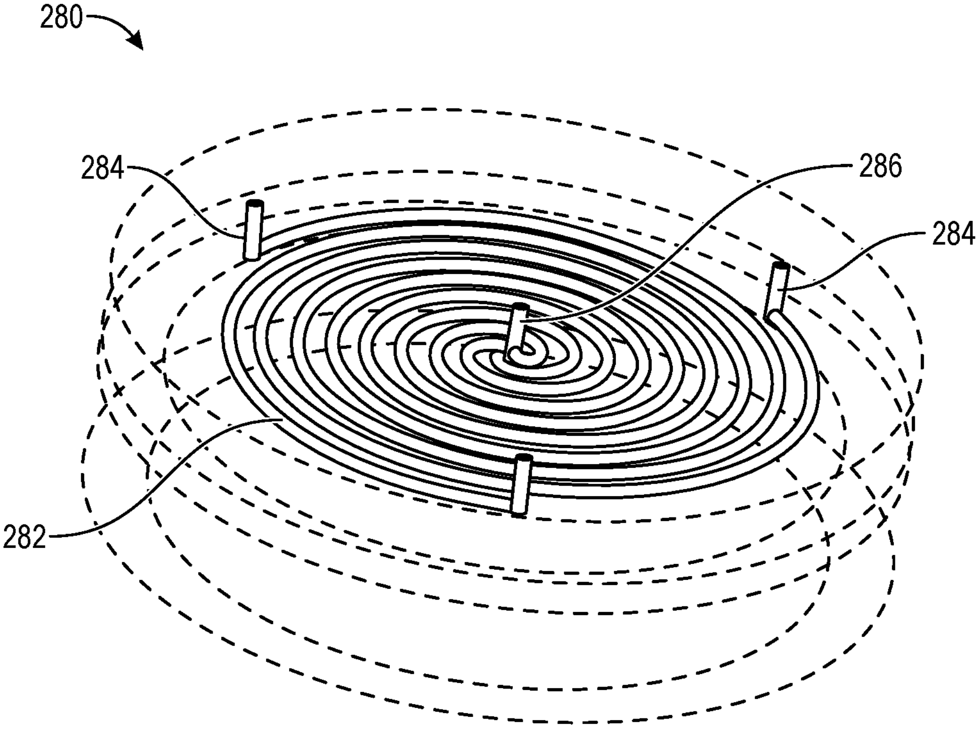
FIGS. 2N-2P are diagrams illustrating an angled semi-transparent view of an example inductively coupled plasma (ICP) chamber having a 3-phase rotating crossflow according to one embodiment.
Figure 2O:
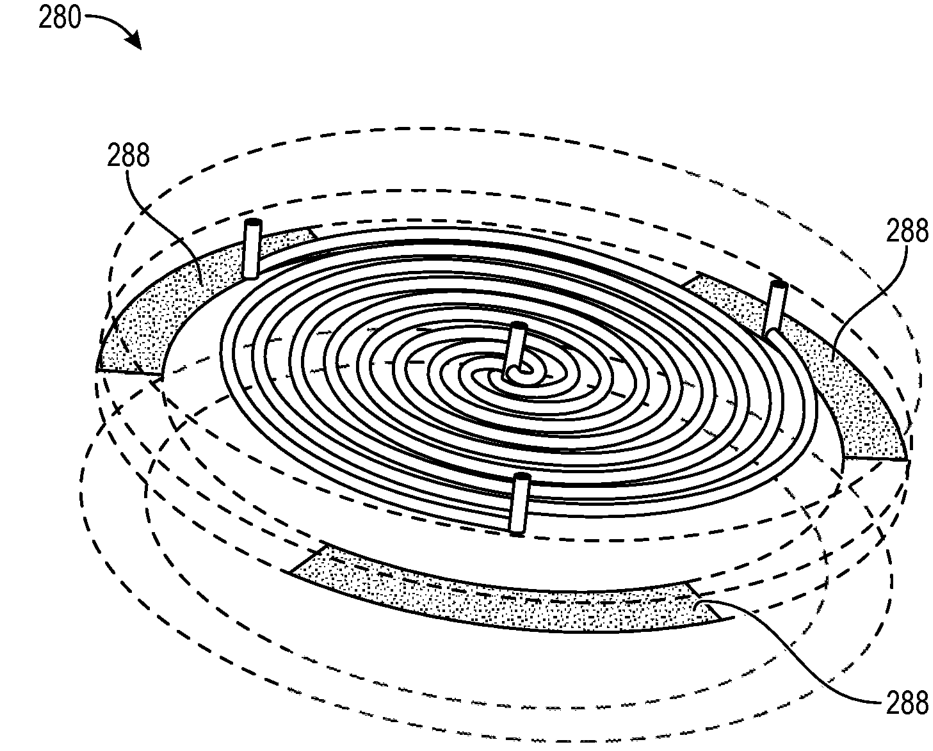
Figure 2P:
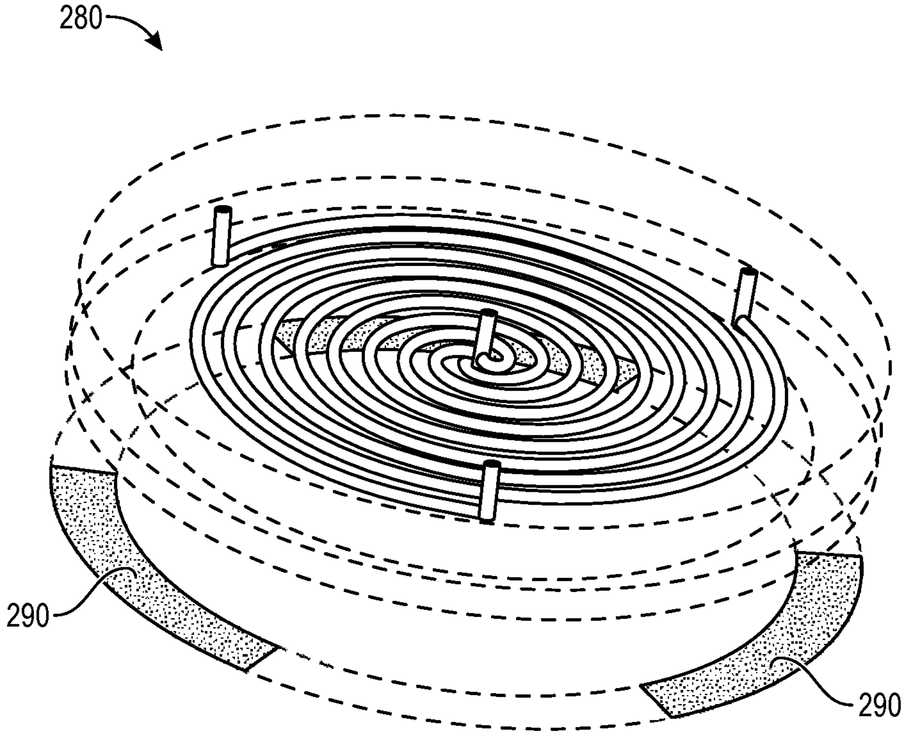

Referring to FIGS. 2K-2M, whether conductance control ring 285 is above or below the plasma screens 129, one or more actuators 291 is located in the sidewall of the chamber or the pump port(s) that rotates the conductance control ring 285 laterally or horizontally around pedestal 108. The actuator 291 may be mechanical or magnetic. Actuator 291 is coupled to controller 140 (FIG. 1B), which synchronizes the rotational movement of the conductance control ring 285 to the various cross-flow phases. In embodiments, the controller 140 can use machine learning to set and/or control the gas pulse and rotation sequence/timing. The actuator 291 stops the rotation of the conductance control ring 285 such that the opening 287 is aligned with one of the pump ports 120, which opens the corresponding pump port, and closes the other pump ports. In FIGS. 2L and 2M, the opening 287 of the conductance control ring 285 is aligned over pump port 120A, which closes pump port 120B (and pump port 120C, which is not visible in this view). FIGS. 2N-2P are diagrams illustrating an angled semi-transparent view of an example inductively coupled plasma (ICP) chamber having a 3-phase rotating cross-flow according to one embodiment. As shown in FIG. 2N, the ICP chamber 280 includes an electrode 282 in the form of a planar multi-spiral coil adjacent to the chamber lid (not shown). The electrode 282 includes a post 286 that is RF driven and may include three grounded ends 284 along the largest radii. FIG. 2O shows gas injectors 288 located symmetrically arranged around an outer periphery of the chamber lid. In one embodiment, the gas injectors 288 may comprise 60° wide inlets with a 60° wide space therebetween. FIG. 2P shows pump ports 290 symmetrically arranged around an outer periphery of the chamber bottom, each located directly 180° opposing one of the gas injectors 288.

Figure 3A:
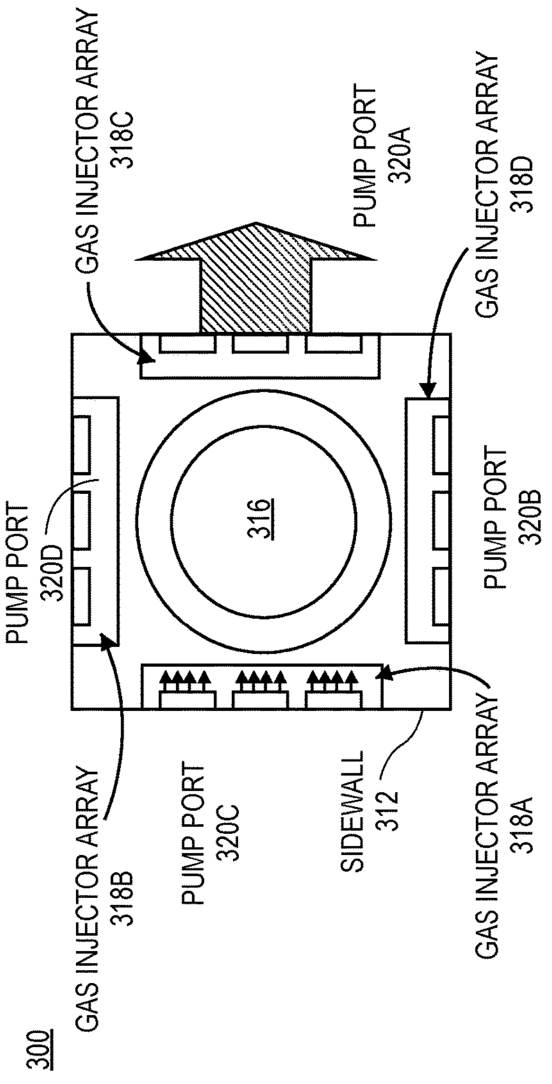
FIG. 3A is a diagram illustrating a top view of a plasma treatment chamber having a 4-phase rotating crossflow according to an embodiment.

FIGS. 3A-3F are diagrams illustrating top views of a plasma treatment chamber having a 4-phase rotating cross-flow operation according to one embodiment. FIG. 3A is a diagram illustrating the plasma treatment chamber 300, which may have a square shape having four sidewalls 312. Each of the four sidewalls 312 includes one of the four gas injector arrays 318A-318D and one of the four opposing pump ports 320A-320D.

Figure 3B:
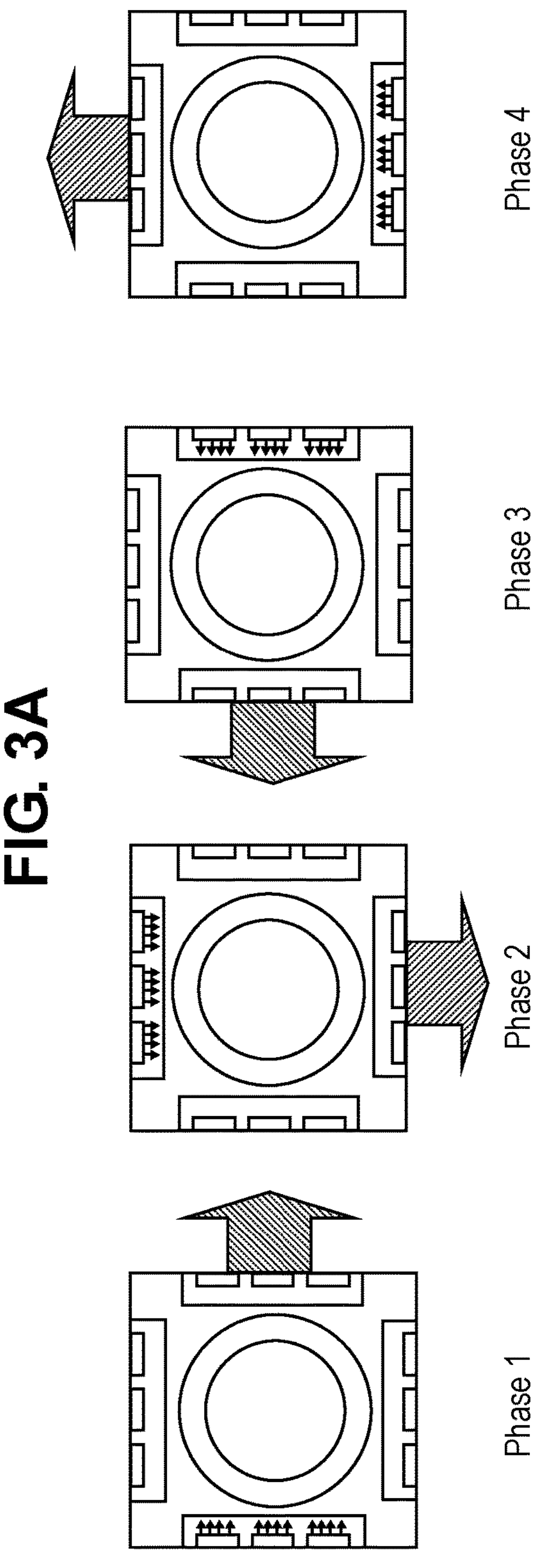
FIG. 3B is a diagram illustrating a 4-phase rotating crossflow operation according to an embodiment.

FIG. 3B is a diagram illustrating a 4-phase rotating crossflow operation. Over a 4-phase cycle, gas is injected from each of the four sidewalls 312 and pumped out from an opposite side. Conductance of each pump ports 320A-320D can be modulated with fast individual throttle valves. Phase 1 shows a left to right first gas flow. Phase 2 shows a clock-wise rotation to a top-to-bottom second gas flow. Phase 3 shows a clock-wise rotation to a right-to-left third gas flow. And phase 4 shows a clock-wise rotation to a bottom-to-top fourth gas flow. In one embodiment, each phase may last approximately 0.5 to 60 seconds depending on the application.

Figure 3C:
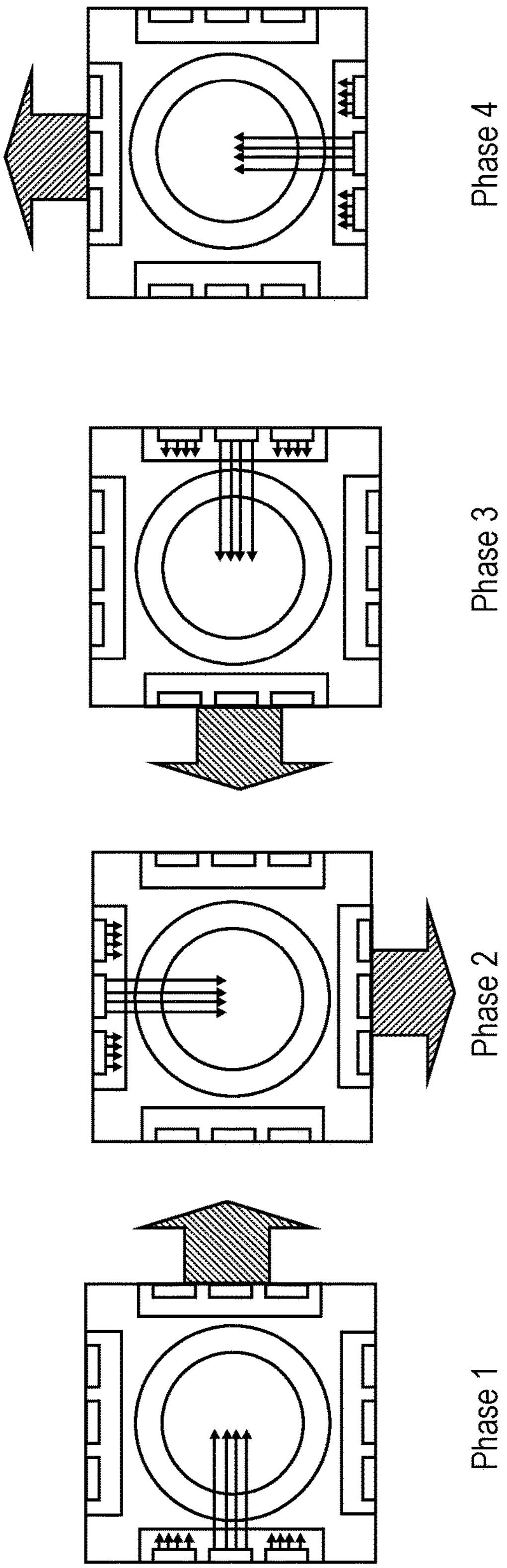
FIGS. 3C and 3D are diagram illustrating a 4-phase rotating crossflow operation with deliberate non-uniform center and edge gas injection with opposite side port pumping according to a further aspect of the disclosed embodiments.
Figure 3D:
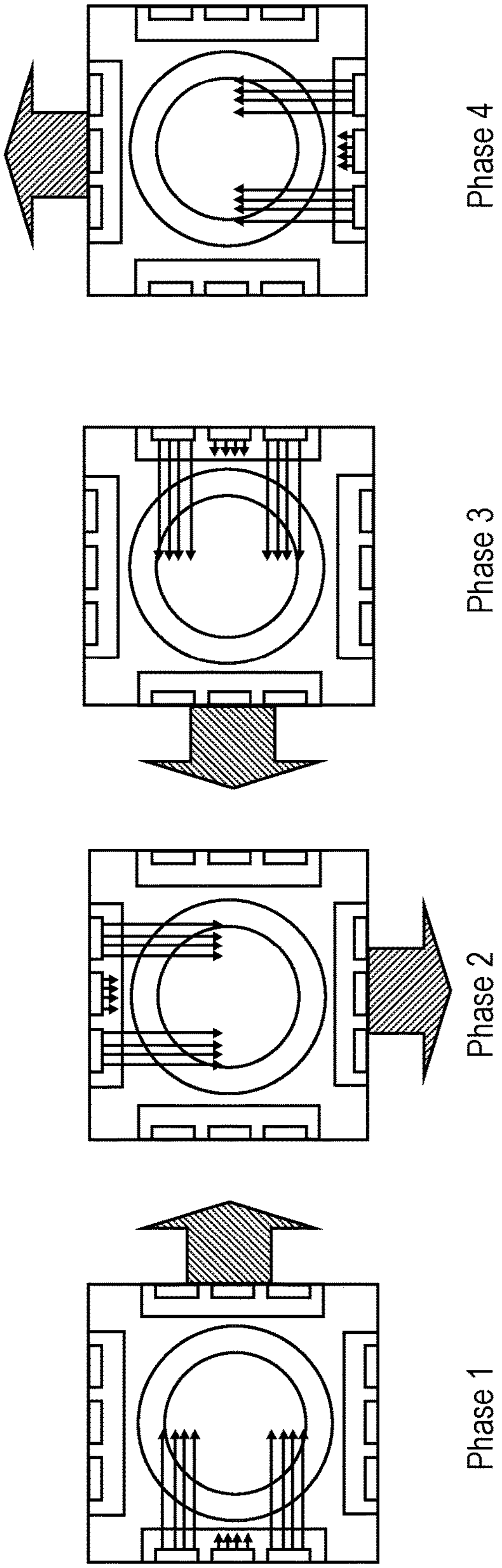

FIGS. 3C and 3D are diagram illustrating a 4-phase rotating crossflow operation with deliberate non-uniform center and edge gas injection with opposite side port pumping according to a further aspect of the disclosed embodiments. In this embodiment, the individual gas injectors in each of the gas injector arrays 318A-318D can be switched on/off or have a modulated flow rate controlled by the gas inlet valves 122. FIG. 3C shows a 4-phase example of a center-to-edge gas flow, where in each phase the gas flow injected from center ones of the individual gas injectors in each of the gas injector arrays 318A-318D has a greater flow rate relative to edge ones in the gas injector arrays 318A-318D. FIG. 3D shows a 4-phase example of an edge-to-center gas flow, where the gas flow injected from edge ones of the individual gas injectors in each of the gas injector arrays 318A-318D has a greater flow rate relative to center ones in the gas injector arrays 318A-318D. Such non-uniform center and edge gas injection of the disclosed embodiments may be deliberately changed and controlled over time to control workpiece process uniformity. In an embodiment, during one cycle, between cycles, or between sets of cycles, relative center and edge flows of one or more of the gas injectors are varied.

Figure 3F:
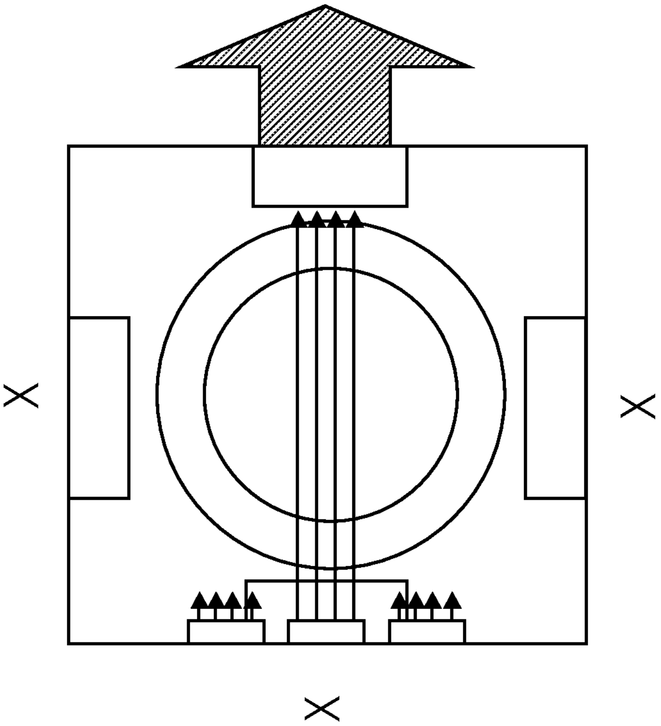
FIG. 3F is a diagram illustrating a single phase of a multiphase cycle where gas flow is directed across the workpiece using smaller width pump ports according to an embodiment.
Figure 3E:
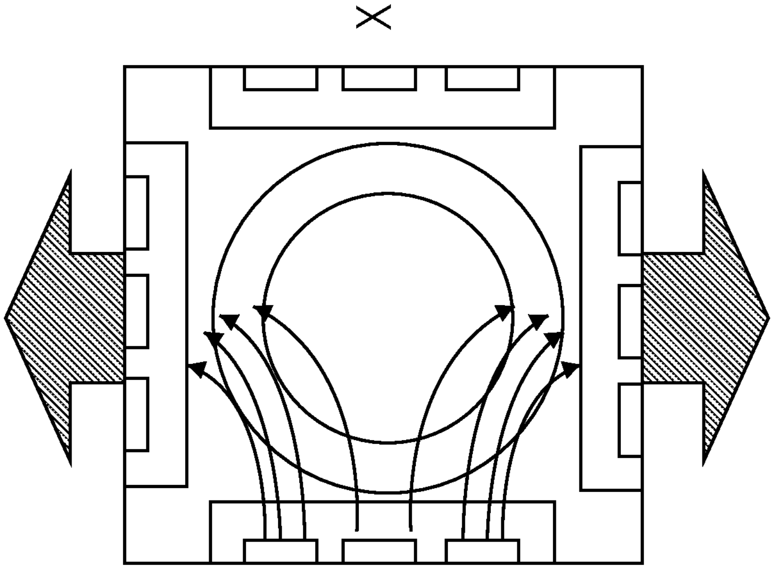
FIG. 3E is a diagram illustrating a single phase of a multiphase rotating crossflow operation in which at least a portion of the gas flow is diverted to the sides of the workpiece rather than a 100% cross-flow across the workpiece according to an embodiment.

FIG. 3E is a diagram illustrating a single phase of a multiphase (e.g., 4-phase) rotating crossflow operation in which at least a portion of the gas flow is diverted to the sides of the workpiece rather than a 100% cross-flow across the workpiece. In this extreme case, the opposing pump port is closed while the side pump ports are open, minimizing gas flow and velocity across the center of the workpiece. This process may be used to control uniformity. In embodiments, such a diverted gas flow as shown in FIG. 3E is used for an entirety of a process, or for only a portion of a cycle or for one or a smaller set of cycles in a process scheme. In embodiments, a diverted gas flow is rotated around a chamber for one or many cycles.

FIG. 3F is a diagram illustrating a single phase of a multiphase cycle where gas flow is directed across the workpiece using smaller width pump ports. As in FIG. 3C, the gas flow from center ones of the individual gas injectors in each gas injector array has a greater flow rate relative to edge ones in the gas injector array, and the opposing pump port is open, while the others are closed. In a further embodiment, the smaller width pump ports compared to the embodiments described above, force the gas flow across the center region of the workpiece. In this embodiment, for a typical 300 mm wafer chamber, the smaller pump ports may have dimensions of 3.5" wide×(1/plurality)×(14") long center line radial arc length, while the larger single pump ports may have dimensions of 3.5" wide×14" long center line radial arc length. In general, the pump ports should have dimensions, or size, adequate for the process applications flow conductance while narrow enough port width opening to promote uniform "cross-flow" over the wafer from gas inlet side of chamber to pump port side.

Figure 4A:
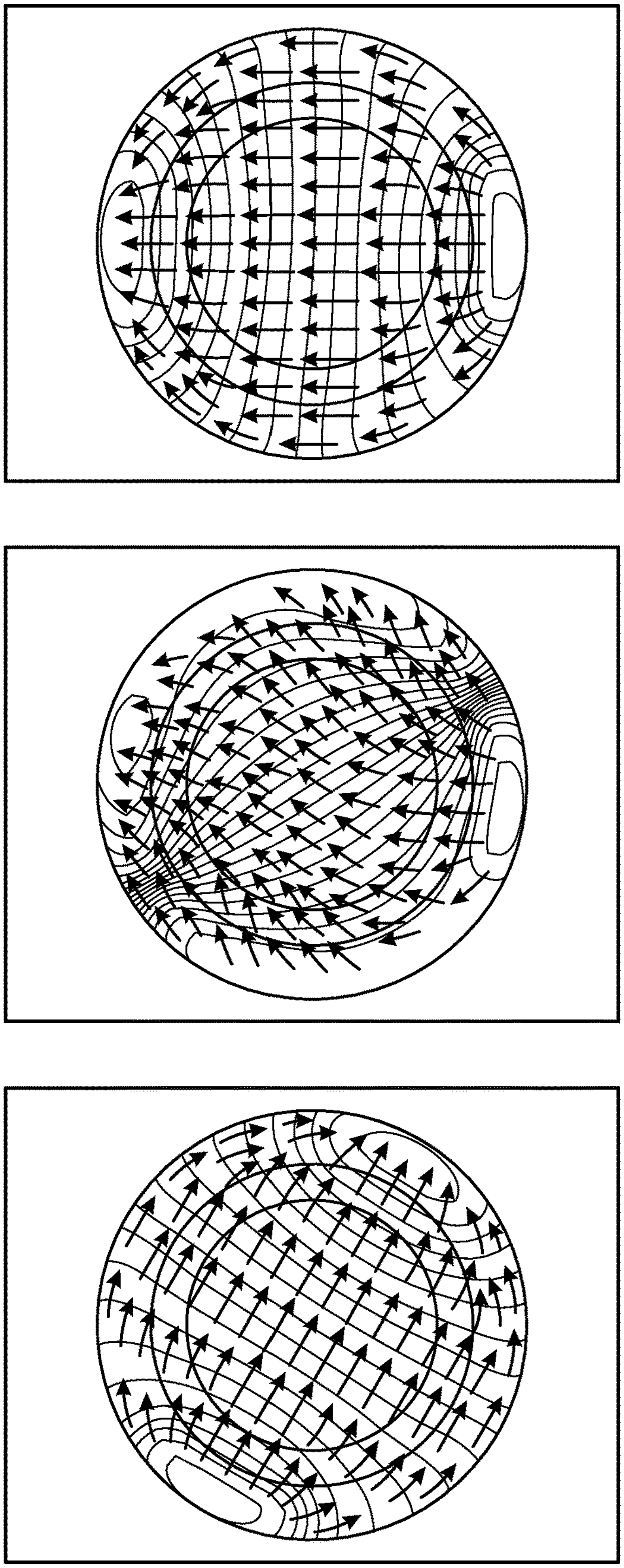
FIGS. 4A-4C are diagrams showing top views of a rotating gas flow in a 3-phase rotating crossflow plotted in time every 60° according to an embodiment.
Figure 4B:
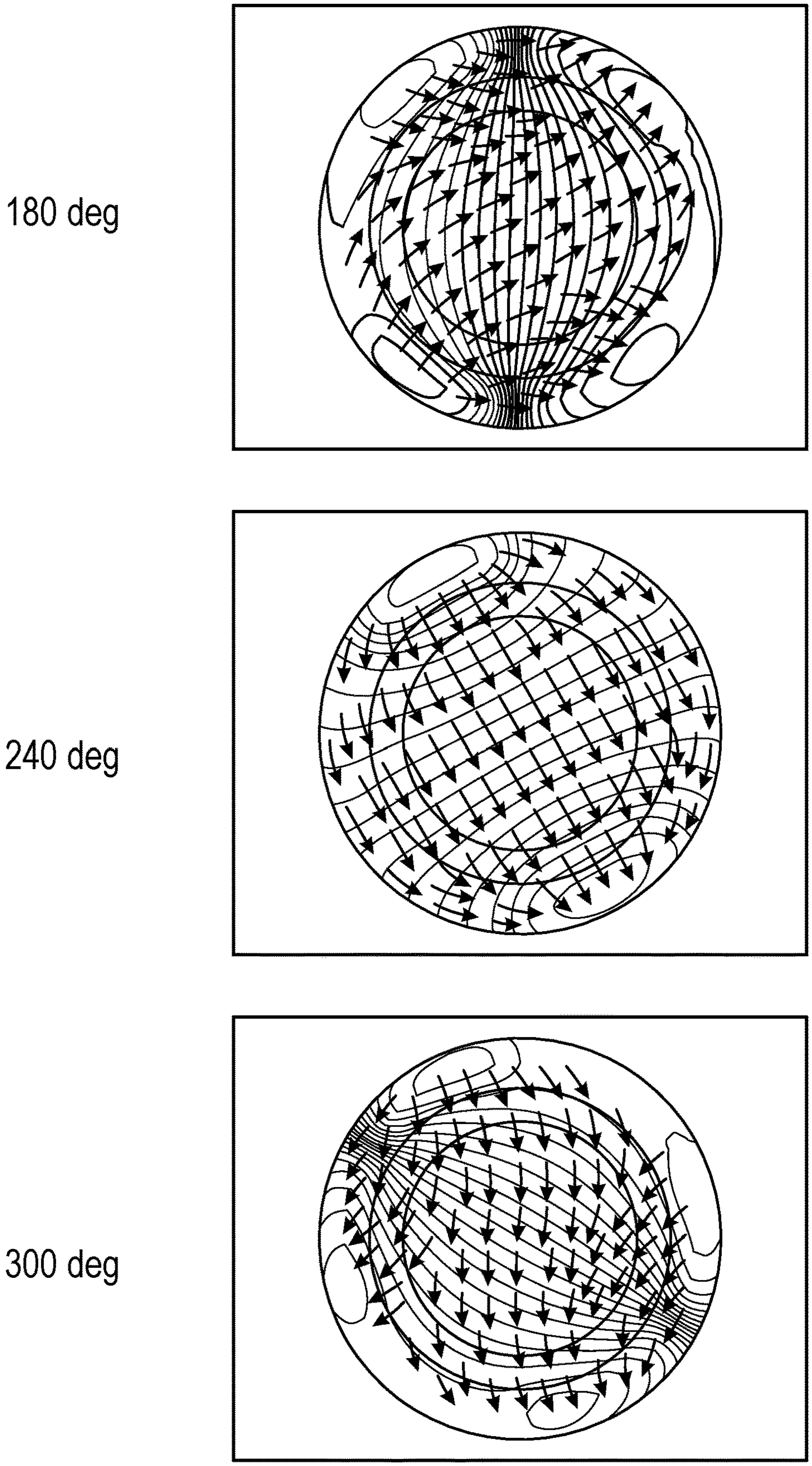
Figure 4C:
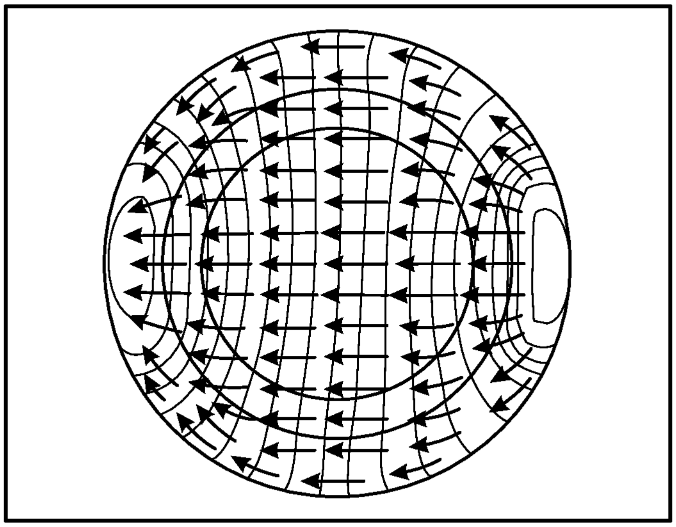
Figure 4C:
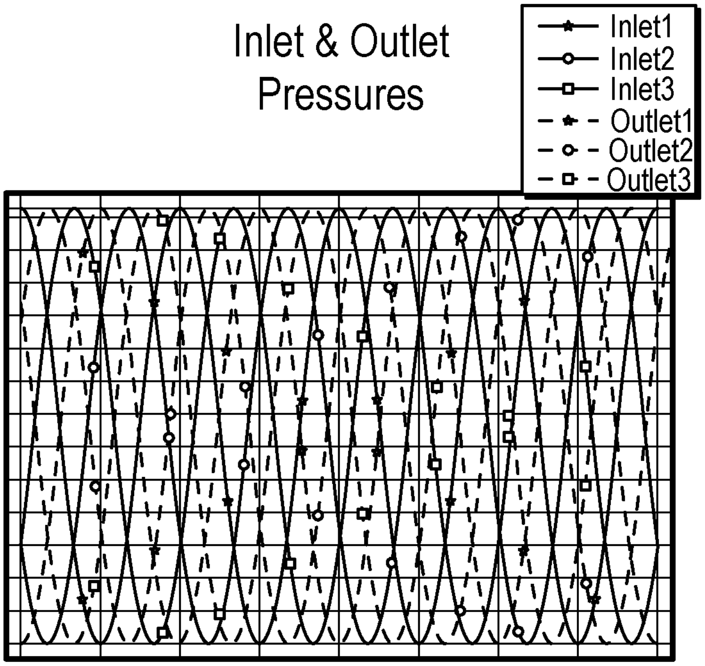

FIGS. 4A-4C are diagrams showing top views of a rotating gas flow in a 3-phase rotating cross-flow plotted in time every 60°. The arrows represent vectors showing a magnitude of velocities and the contours represent pressure gradients. Snapshots of the gas flow are shown at 0°, 60°, 120°, 180°, 240°, and 300°. A graph in FIG. 4C shows that gas injector and pump port pressures over time are relatively consistent across the 3-phases.

The example operations shown in FIGS. 4A-4C may be used individually or more likely in combination, over a repetitive cycle, for maximizing process uniformity. This tuning capability, which uses gas injection and/or pumping at peripheral boundaries and outside of the dense plasma region as control inputs, without introducing geometric discontinuities (i.e., gas injection holes), allows formation of a uniform plasma with minimal drift or change over time due to etching, wear, or coating of exposed plasma facing surfaces, namely electrode/showerheads with gas holes or gas nozzles. The use of rotating modulated cross-flows can permit process uniformity control from the peripheral boundaries of the chamber.

Reactive Ion Etching

As an example application, the plasma treatment chamber may be used to perform precise reactive ion etching during semiconductor manufacturing.

Figure 5:
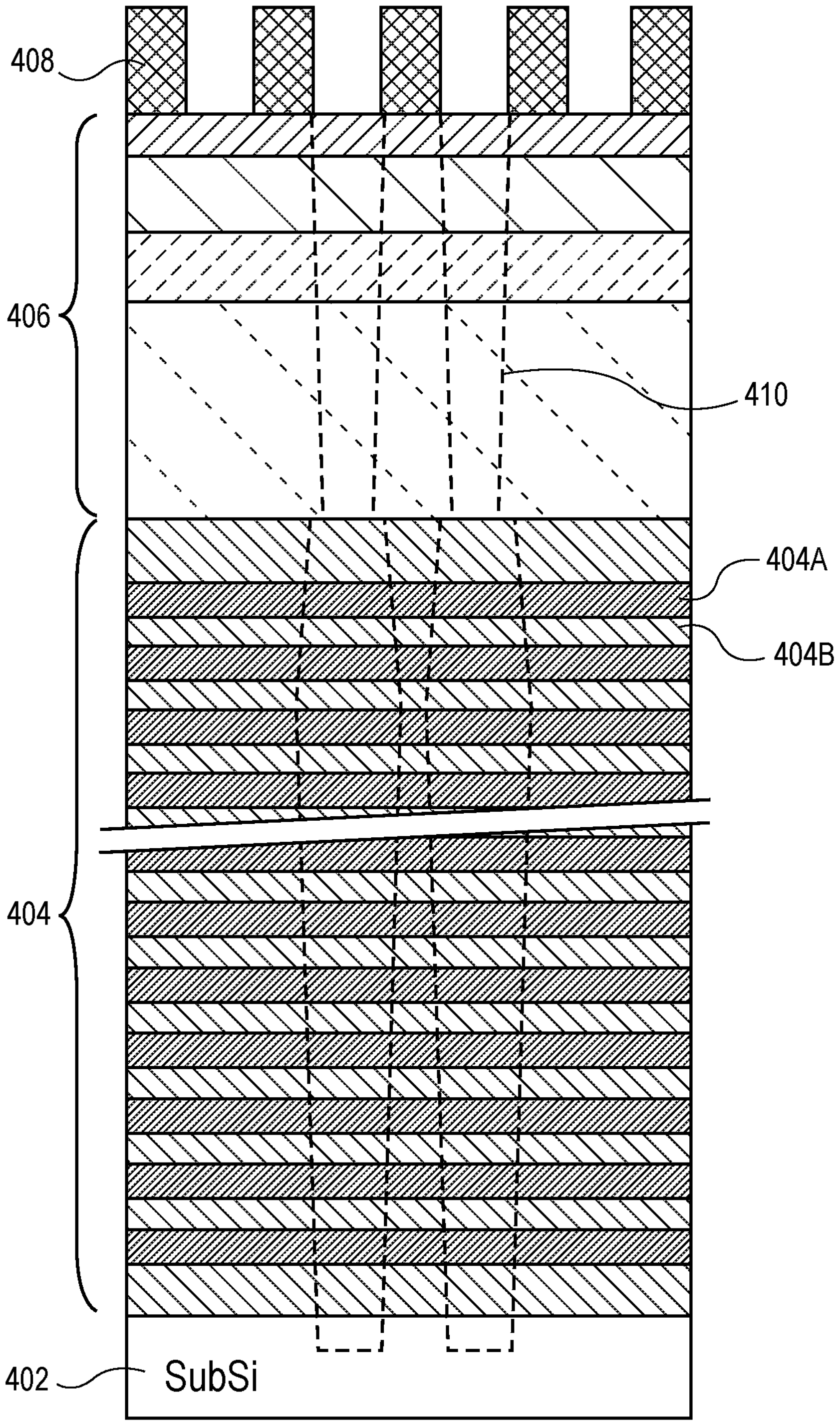
FIG. 5 illustrates a cross-sectional view of a portion of wafer comprising a stacked memory device which may be processed by a plasma treatment chamber with rotating gas crossflows according to an embodiment.

FIG. 5 illustrates a cross-sectional view of a portion of wafer comprising a stacked memory device as processed by the plasma treatment chamber with rotating gas cross-flows according to one embodiment. In one embodiment, an intermediate structure of the stacked memory device is shown during fabrication. In one embodiment the intermediate structure 400 will comprise a 3D-NAND structure and includes a substrate 402, an alternating layer stack 404 over the substrate 402, inter layer dielectric (ILD) layers 406 over the alternating layer stack 404, and a mask layer 408 over the ILD layers 406. The alternating layer stack 404 may comprise interleaved insulator layers 404A and 404B (e.g., silicon nitride, silicon oxide and the like). Examples of the ILD layers 406 may include spin-on-glass (SOG), SOC, and SiON.

The mask layer 408 may define the pattern of an integrated circuit, with a pattern to guide deposition or removal of material from the wafer in subsequent patterning steps. In this example, reactive ion etching is performed by the plasma treatment chamber to remove the material between some of the openings in the mask layer 408 to form openings 410 through the ILD layers 406 and the alternating layer stack 404 to the substrate 402, where the intersections of the openings 410 and the metal layers 404A may eventually form a memory cell. The gas flows injected by plasma treatment chamber (as described above) can be customized to control both etch depth uniformity as well as aspect ratio (depth-to-width) uniformity of the openings 410. In one embodiment, one or more of the openings 410 may be etched to have a first aspect ratio through the ILD layers 406 and a second aspect ratio through the alternating layer stack 404. In embodiments, one or more of the openings 410 may have a varying aspect ratio, referred to as bowing, through the alternating layer stack 404, as shown. In one embodiment, the openings 410 may be etched to have high aspect ratios greater than 8-1, 9-1 or 10-1. In embodiments, one or more the openings 410 may also have varying etch depth.

In embodiments, 3D-NAND ion etch applications may include a pillar etch as described above, a slit etch, a peri contact etch, a staircase contact etch, and a cell contact-1 etch. In embodiments, aspect ratios, etch depths and bowing characteristics may be parameters that are monitored by a machine learning model, as described below.

Use of a Machine Learning (ML) Model to Control a Plasma Treatment Chamber Having a Multiphase Rotating Cross-Flow Configuring the plasma treatment chamber described above to provide a desired outcome on a workpiece (e.g., wafer) requires a process recipe that comprises a complex combination of many different processing parameters (i.e., knobs) that can be individually controlled. Examples include total gas flow mixture, gas pressure (mTorr), gas flow ramp open times (msec), gas flow time (msec), gas flow ramp closed times (msec) and the like.

In order to develop a process recipe for high volume manufacturing (HVM) process engineers rely on their experience and expertise to identify a baseline recipe that may provide a rough approximation of the desired outcome on the wafer. A design of experiment (DoE) that relies on the processing of a set of wafers (or coupons) in order to identify how the knobs interact is then generated around the baseline recipe. The DoE results may be interpreted by the process engineer to further refine the baseline recipe. Additional DoEs may also be executed in order to converge on the desired outcome on the wafer. Such an iterative process is time and resource intensive.

Additionally, once the final processing recipe has been developed, chamber drift during many iterations of the process for different wafers may result in changes to the outcome on the wafer. Chamber drift may be the result of erosion of consumable portions of the chamber, degradation of components (e.g., sensors, lamps, etc.), deposition of byproduct films over surfaces, or the like. Accordingly, additional tuning is needed even after the extensive recipe development process.

Consequently, recipe development and chamber baselining are time and resource intensive. Particularly, the process space available to tune and optimize a given process is extremely large, and it is practically impossible to explore the entire process space empirically within any reasonable timeframe. Furthermore, due to the interaction between processing parameters and their impact on the process performance, it is extremely hard to predict the combined effect of simultaneous variation of multiple processing parameters by manually scanning one processing parameter at a time.

A second aspect of the disclosed embodiments comprises a semiconductor manufacturing tool utilizing one or more machine learning (ML) models to control the plasma treatment chamber having a multiphase rotating cross-flow. The ML model may be used for developing process recipes and/or processing a device or workpiece. The ML model may connect input processing parameters to device outputs.

In an embodiment a method of controlling processing comprises querying the ML models to control timing of the gas flow rotation. In an embodiment, a method for developing a semiconductor manufacturing process recipe comprises selecting one or more device outcomes, and querying the ML model to obtain a process recipe recommendation suitable for obtaining the device outcomes when processed by the plasma treatment chamber having a multiphase rotating cross-flow. This may be referred to as feed forward process adjustment. In an embodiment, the method may further comprise executing a design of experiment (DoE) on a set of wafers to validate the process recipe recommended by the ML model. Measurements of the DoE may be taken and used to change the process recipe for future wafers, for feedback process adjustments.

Additionally, the ML model may be updated during processing of wafers in a chamber as on-tool performance becomes available and then update a process recommendation or actively change the recipe. This may be referred to as "on the fly" or real-time process adjustments.

Recipe changes may include modifying the recipe within a step, e.g., increasing the rotation frequency of the gas flows when etching the top of the wafer and lowering the rotation frequency as it reaches lower, or vice versa. Another example is the updated machine learning model modifying input parameters within a single rotation, such as making the etch depth slightly different at the beginning and the end of a gas flow rotation when processing of the stacked memory device of FIG. 5. The updated ML model can provide accurate tracking of chamber drift and allows for revisions to the process recipe to be made without extensive DoE of physical wafers or reliance on only the experience and knowledge of a process engineer.

Accordingly, embodiments disclosed herein leverage the use of a ML model to query an entire process space without the need to process physical wafers in a large design of experiment (DoE). Therefore, time and resources dedicated to recipe development can be significantly reduced.

The ML model may be a model of a process space generated from the combination of a statistical model and a physical model. As used herein, a "process space" may refer to a multi-dimensional process space that maps processing parameters to one or more device outcomes on the wafer. The processing parameters, sometime called knobs, are variables that can be controlled to control a process. For example, knobs or processing parameters may include, but are not limited to, any combination of: temperature, RF source power, bias power, gas pressure (mTorr), gas flow ramp open times (msec), gas flow time (msec), gas flow ramp closed time (msec), gas flow fraction at various gas injectors, gas composition at various injectors, gas flow fraction going to various injectors, gas flow rotation frequency, gas flow composition frequency, gas flow rate/velocity (pressure gradient), gas flow direction, gas rotation phase, electron/plasma density, plasma density gradient, electron temperature, ion current density, plasma potential, sheath electric field potential, sheath electric field tilt angle, sheath electric field z-component, mass fractions, fluxes, and ion current density to workpiece.

The device outcomes may refer to measurable properties of features on a wafer after processing. For example, the selected device outcomes may comprise any combination of: a feature profile, a layer thickness, a thickness uniformity, a material composition of a layer, a composition uniformity, a porosity, a film stress, process uniformity across chambers in a facility (e.g., chamber matching), wafer to wafer uniformity, uniformity between different wafer lots, and the like. During an etch processes, the selected device outcomes may further include any combination of: etch rate, etch rate uniformity center-to-edge, etch rate uniformity azimuthal, etch feature uniformity (generally described by top v. bottom critical dimension (CD)), tilt, bow, and mask remaining, VHF-low and VHF-high relative power levels, and if selectable, gap, and the like. That is, device outcomes are not limited to an outcome on a single wafer. Each point in the process space may be a representation of a set of processing parameter values and the resulting device outcome (or outcomes) produced by the set of processing parameters.

In an embodiment, the statistical model of the ML model may be built using a DoE of actual wafers to populate a portion of the process space. Algorithms may then be used to extrapolate the remainder of the process space. The physical model is based on real world physical and chemical interactions that occur within the processing chamber. A simulation of the physical and chemical interactions in the processing chamber over a range of different processing parameters may be used to generate the physical model. In an embodiment, the physical model is merged with the statistical model to provide the ML model. For example, the physical model may be used to fill any gaps in the statistical model and/or to verify extrapolated data points.

Figure 6:
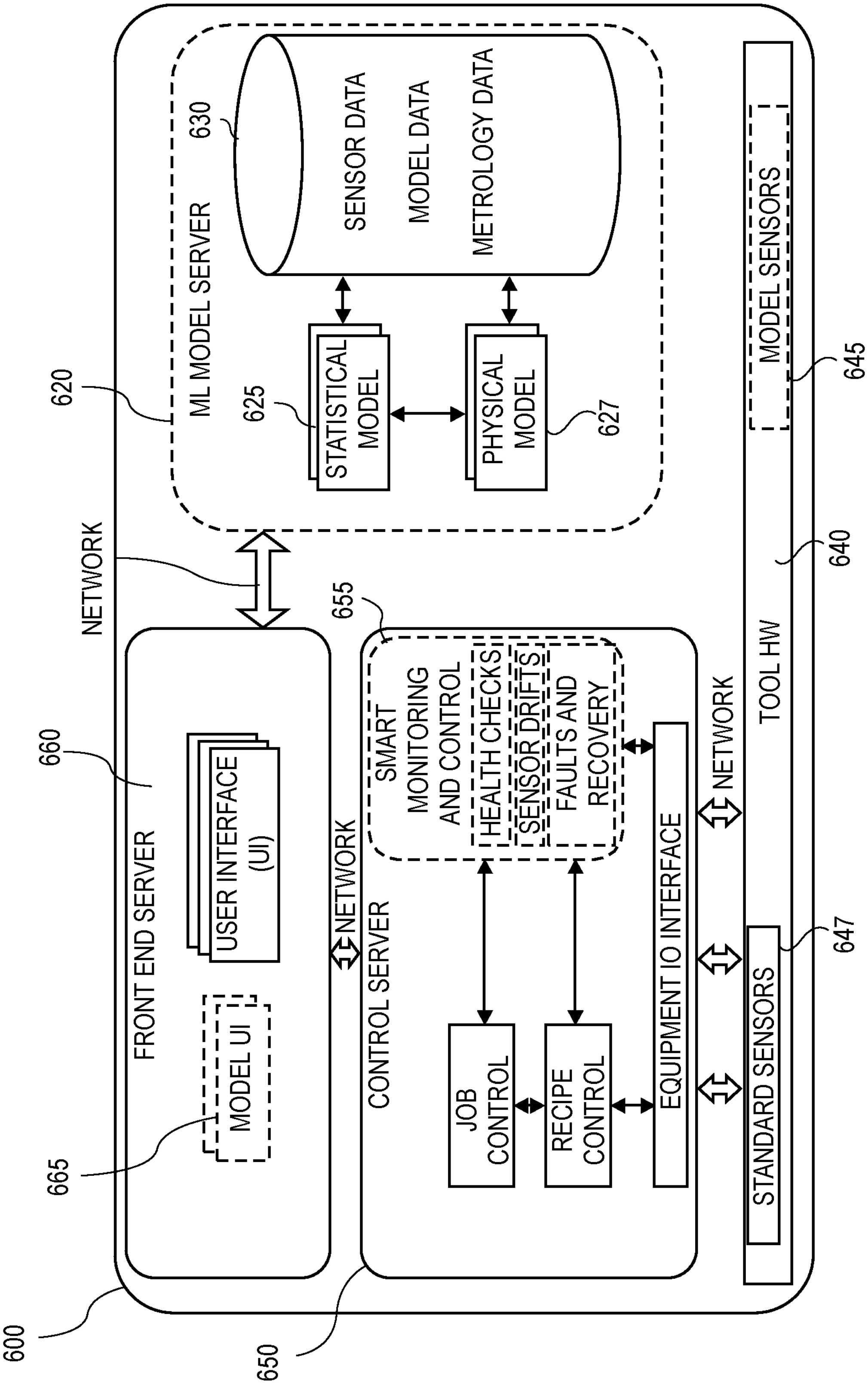
Referring now to FIG. 6, a block diagram of a processing tool is shown utilizing a machine learning (ML) model, in accordance with an embodiment.

Referring now to FIG. 6, a block diagram of a processing tool 600 is shown utilizing a ML model, in accordance with an embodiment. The processing tool 600 comprises tool hardware 640 corresponding to the plasma treatment chamber described above, a machine learning model server 620, a front end server 660, and a control server 650.

In an embodiment, the ML model server 620 may include a statistical model 625 and a physical model 627. The statistical model 625 and the physical model 627 may be communicatively coupled to a database 630 for storing input data (e.g., sensor data, model data, metrology data, etc.) used to build and/or update the statistical model 625 and the physical model 627.

In an embodiment, the statistical model 625 may be generated from a physical DoE and use interpolation to provide an expanded process space model. The physical wafers that are processed may be used to provide a mapping of processing parameters to specific device outcomes. The physical DoE may also be used to identify interactions between different processing parameters. After the data (e.g., metrology data, sensor data, process parameter data, etc.) for the physical wafers is provided, interpolation is used to fill gaps in the process space. In an embodiment, data, such as metrology data, may be obtained using an external tool that is communicatively coupled to the ML model server 620 by a data link (e.g., a wired or wireless data link). The interpolation may be done using any suitable algorithm or algorithms. Algorithms may include, but are not limited to a neural network, deep learning or any other known techniques used for regression analysis (e.g., linear, partial least squares, Gaussian, polynomials, convolution neural networks for regression, regression trees and others).

In an embodiment, the statistical model 625 may be provided as a module that is sold or licensed for use in conjunction with the processing tool. That is, a physical DoE for the statistical model 625 may be executed by the manufacturer of the processing tool. In other embodiments, the statistical model 625 may be generated by executing the physical DoE on-site. In yet another embodiment, a generic statistical model 625 may be provided by the tool manufacturer and a subsequent physical DoE may be executed on-site to provide a calibration of the statistical model 625 to more closely model the particular processing tool being investigated.

In an embodiment, the physical model 627 may be generated using real world physics and chemistry relationships. For example, physics and chemistry equations for various interactions within a processing chamber may be used to build the physical model. The physical model 627 may also utilize chamber geometries or other chamber configurations to improve the accuracy of the physical model 627. The physical model 627 may be the result of a simulation of the physical and chemical interactions within a processing tool across a plurality of different processing parameters. The physical model 627 may be a module that is sold or licensed for use in conjunction with the processing tool.

In an embodiment, the physical model 627 and the statistical model 625 may be able to reference each other (as indicated by the arrow). Cross-referencing between the two models 627 and 625 allows for validation of each of the models and for filling in any gaps in the individual models. In an embodiment, the physical model 627 and the statistical model 625 may be combined to provide a more robust ML model.

As shown, the ML model server 620 may be integrated with the processing tool 600. For example, the ML model server 620 may be communicatively coupled to a front end server 660 by a network connection, as indicated by the arrow. However, in other embodiments, the ML model server 620 may be external to the processing tool 600. For example, ML model server 620 may be communicatively coupled to the processing tool 600 through an external network or the like.

In an embodiment, the front end server 660 may comprise a user interface 665 for the ML model server 620. The user interface 665 provides an interface for a process engineer to utilize the ML modeling in order to execute various operations, such as recipe development or chamber baselining, as will be described in greater detail below. In one embodiment, the user interface 665 may correspond to user interface 142 of FIG. 1B.

The control server 650 may comprise a smart monitoring and control block 655. The smart monitoring and control block 655 may comprise modules for providing diagnostics and other monitoring of the processing tool 600. Modules may include, but are not limited to health checks, sensor drift, fault recovery, and leak detection. The smart monitoring and control block 655 may receive data from various sensors implemented in the tool hardware 640 as inputs. The sensors may include standard sensors 647 that are generally present in semiconductor manufacturing tools 600 to allow for operation of the tool 600. The sensors may also include modelling sensors 645 that are added into the tool 600. The modelling sensors 645 provide additional information that is necessary for the building of highly detailed ML models. For example, the modelling sensors may include virtual sensors and/or witness sensors. Virtual sensors may utilize the data obtained from two or more physical sensors and implement interpolation and/or extrapolation in order to provide additional sensor data not obtainable from physical sensors alone. In a particular example, a virtual sensor may utilize an upstream pressure sensor and a downstream pressure sensor in order to calculate a flow rate through a portion of the processing tool, such as a gas cartridge. Generally, modelling sensors may include any type of sensor, such as, but not limited to, pressure sensors, temperature sensors, and gas concentration sensors. In an embodiment, the smart monitoring and control block 655 may provide data that is used by the ML model server 620. In other embodiments, output data from the various modelling sensors 645 may be provided directly to the ML model server 620. In one embodiment, the control server 650 may correspond to controller 140 of FIG. 1B.

Figure 7A:
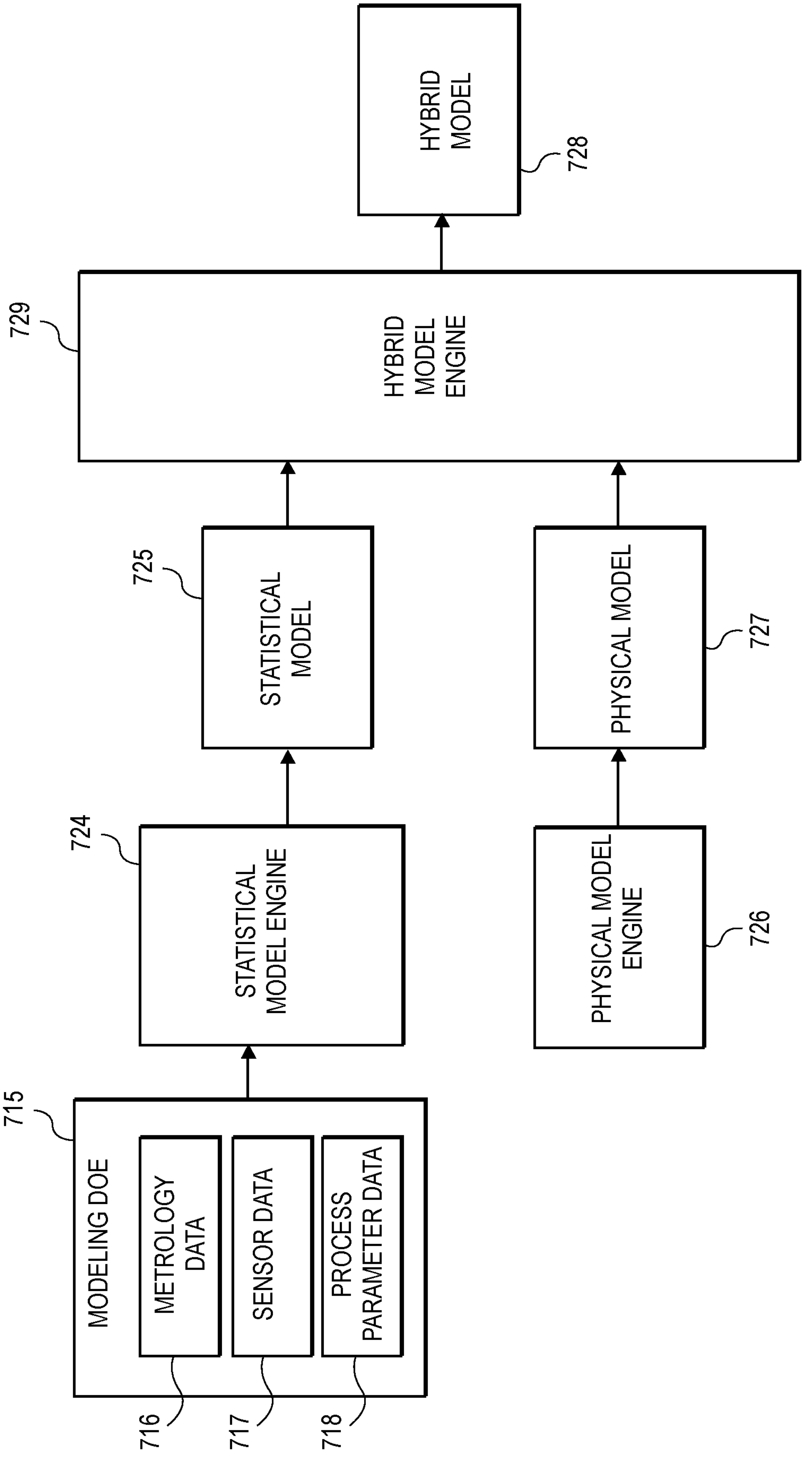
FIGS. 7A and 7B are flow diagrams illustrating a process for generating a ML model, in accordance with an embodiment.

Referring now to FIG. 7A, a flow diagram illustrating a process for generating a ML model is shown, in accordance with an embodiment. In an embodiment, input from a modeling DoE 715 is inputted into a statistical model engine 724. The modeling DoE 715 may include the processing of a number of physical wafers. The DoE 715 may include various data sources that are fed to the statistical model engine 724. For example, metrology data 716 obtained during or after processing the wafers may be provided to the statistical model engine 724. Additionally, sensor data 717 from sensors in the processing tool may be provided to the statistical model engine 724. Process parameter data 718 (i.e., the values of various process parameters during the processing of the wafers) may also be provided to the statistical model engine 724.

In an embodiment, the statistical model engine 724 may be implemented as hardware and/or software suitable for analyzing the various data sources and outputting a statistical model 725. The statistical model engine 724 may utilize machine learning based on neural networks, or any other known techniques used for regression analysis (e.g., linear, partial least squares, Gaussian, polynomials, convolution neural networks for regression, regression trees, and others) in order to interpolate a larger process space than is available from the physical DoE data alone.

In an embodiment, a physical model engine 726 is used to generate the physical model 727. In an embodiment, the physical model engine 726 may be implemented as hardware and/or software. The physical model engine 726 takes as inputs the chamber configuration and real world physics and chemical equations. The physical model engine 726 may implement a simulation of the physical and chemical interactions within a processing tool across a plurality of different processing parameters in order to build the physical model 727. As such, changes to processing parameters that modify the physical and/or chemical reactions in the processing tool may be mapped to expected device outcomes.

In an embodiment, the statistical model 725 and the physical model 727 are used as inputs for the generation of a ML model 728. For example, the statistical model 725 and the physical model 727 may be inputs for a ML model engine 729. The ML model engine 729 processes the physical model 727 and the statistical model 725 and outputs the ML model 728. In some embodiments, the physical model 727 may be used to derive some physical measurements that cannot be measured, and the physical model 727 outputs may be considered as additional inputs to the statistical model. In such situations, the ML model engine 729 adds the information from the physical model 727 to the statistical model 725 to provide the ML model 728. The ML model 728, therefore, allows for the two models 725 and 727 to be used for validation of individual points in the process space, and provides a more complete process space that can be individually tailored to a given processing tool. However, in some embodiments, the physical model 727 and the statistical model 725 may be standalone models, depending on the outputs. That is, in some embodiments, the statistical model 725 and the physical model 727 may not be merged into a ML model.

Figure 7B:
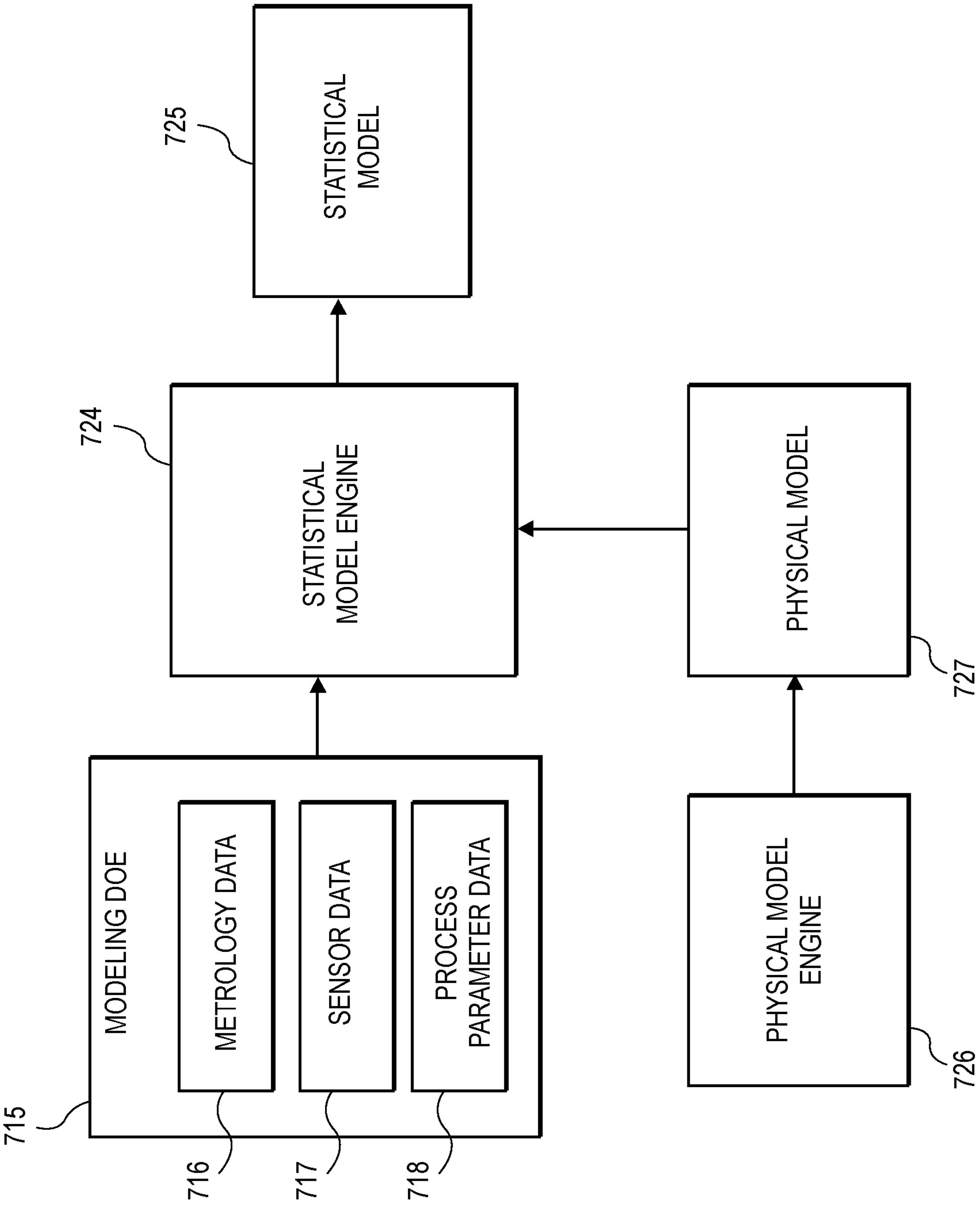

In an embodiment, the ML model may also be considered as another instance of a statistical model 725. For example, in FIG. 7B, the physical model 727 output by the physical model engine 726 may be used as an input for the statistical model engine 724. The statistical model engine 724 therefore has additional inputs in order to generate a statistical model 725 that includes information from the physical model 727. Particularly, the statistical model engine 724 may already include the data from the physical model 727, and the use of a ML model engine to produce a ML model may not be necessary in all embodiments.

Figure 8:
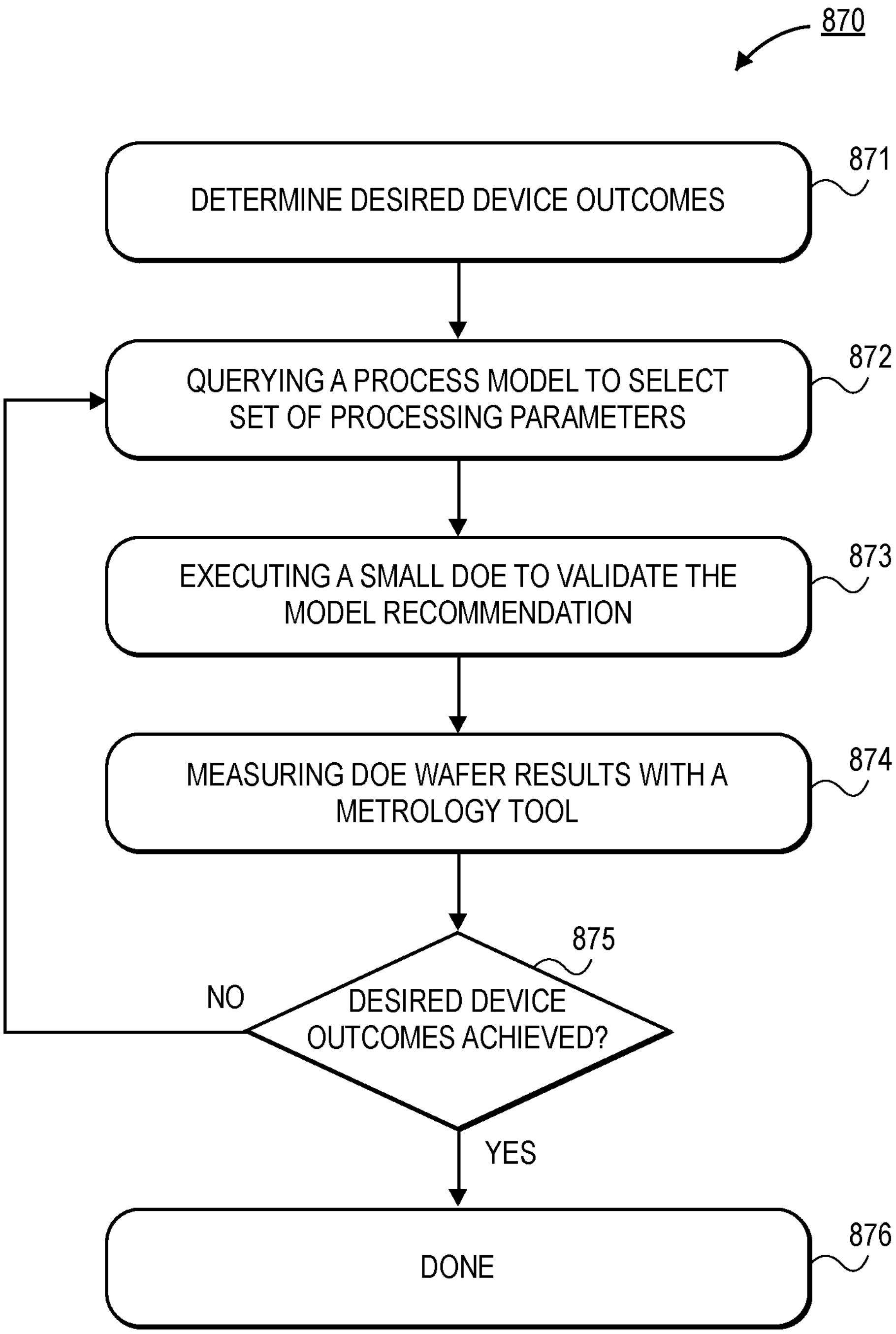
FIG. 8 shows a flow diagram illustrating a process for developing a process recipe using a ML model is shown, in accordance with an embodiment.

Referring now to FIG. 8 a flow diagram illustrating a process 870 for developing a process recipe using a ML model is shown, in accordance with an embodiment. The targeted process recipe is a process recipe having a set of process parameters that will result in desired device outcomes on the wafer. In an embodiment, the process 870 may begin with operation 871, which includes determining desired device outcomes. In an embodiment, the device outcomes may be on wafer device dimensions, material compositions, or the like. For example, the device outcomes may include a layer thickness, a thickness uniformity across the wafer, a material composition of a layer, or a material composition uniformity for the stacked memory device shown in FIG. 5.

In an embodiment, process 870 may continue with operation 872, which comprises querying a ML model to select a set of processing parameters. In an embodiment, the ML model may be a model of a process space generated from the combination of a statistical model and a physical model. The statistical model may be generated using a DoE of actual wafers as described above. The physical model may be based on real world physics and chemical equations. For example, the physical model may be generated from a simulation of physical and chemical interactions within the processing tool across a plurality of different processing parameters. In an embodiment, the ML model may cover an entire process space available to the processing tool.

The ML model allows for a stable process recipe to be identified without relying solely on the experience and knowledge of a process engineer. Instead, a baseline recipe that is expected to produce device outcomes that closely match the targeted device outcomes is able to be selected from the process space of the ML model.

In an embodiment, process 870 may continue with operation 873, which comprises executing a small DoE to validate the model recommendation. Due to the high precision of the ML model, a small DoE (e.g., 20 or fewer wafers) may be all that is needed to validate the model recommendation. In an embodiment, the DoE may be designed by a process engineer. In another embodiment, the DoE may be designed using the ML model.

In an embodiment, process 870 may continue with operation 874, which comprises measuring the DoE wafer results with one or more metrology tools. The metrology data can be used to verify that the targeted device outcomes have been achieved on the wafer.

In an embodiment, process 870 may continue with operation 875, which comprises determining if the desired device outcomes have been achieved. If the desired device outcomes have been achieved, then the process proceeds along to operation 876 and the process is completed. If the desired device outcomes have not been achieved, then the process may cycle or feedback to operation 872. In an embodiment, the data from the small DoE may be fed back into the ML model in order to update the ML model. For example, if the process iteratively cycles back to operation 872, then DoEs executed at operation 873 may be designed based on knowledge of where the ML model is lacking (e.g., for a particular a process or plasma chamber) based on additional knowledge learned from the DoEs executed in the prior cycles. The updated ML model may then be queried to provide a second baseline recipe. In this manner, even when the first iteration is not successful, the process may still converge to the proper recipe quickly, without the need for extensive DoE and wasted resources.

Figure 9:
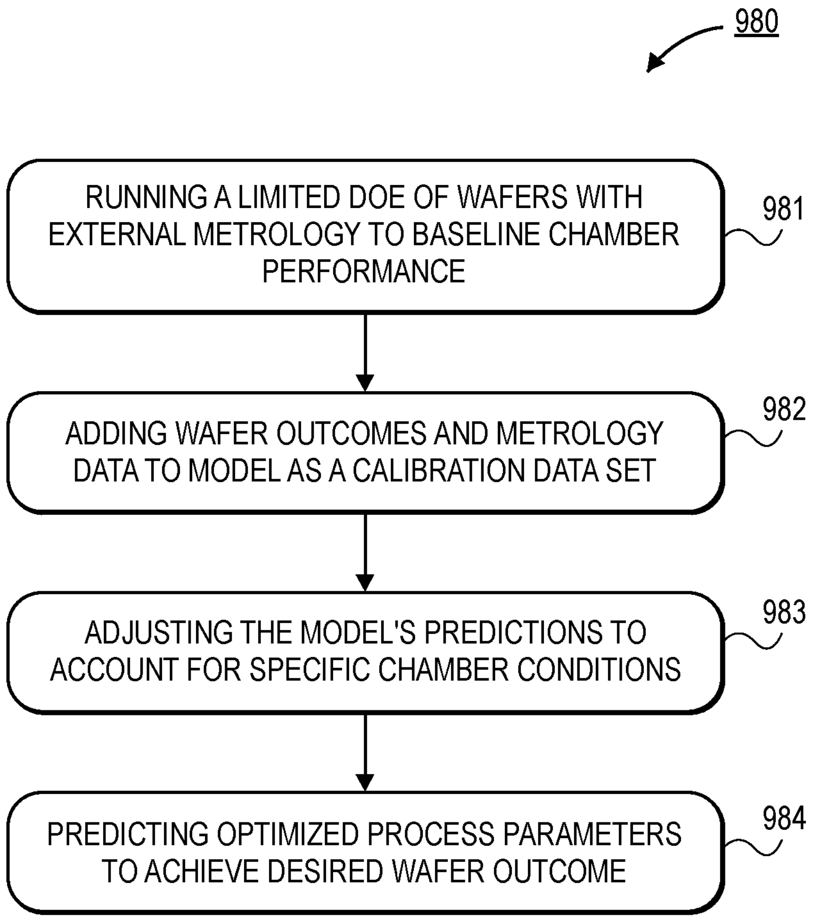
FIG. 9 shows a flow diagram illustrating a process for baselining a processing tool, in accordance with an embodiment.

Referring now to FIG. 9, a flow diagram illustrating a process 980 for baselining a processing tool is shown, in accordance with an embodiment. In an embodiment, the baselining process may be beneficial to account for chamber drift during the processing of wafers in the processing tool. In an embodiment, the baselining process may be implemented at any desired frequency. For example, the process 980 may be implemented per lot, per planned maintenance (PM) event, or when the processed wafers have device outcomes that are outside of specified ranges.

In an embodiment, the process 980 may begin with operation 981, which comprises running a limited DoE of wafers with external metrology to baseline chamber performance. In an embodiment, the limited DoE may include twenty wafers or fewer. The limited DoE may utilize the process recipe of record as a baseline. The external metrology may include any metrology suitable to determine device outcomes for the processed wafers. For example, in the case of an oxidation process, ellipsometry may be used to investigate film thickness and thickness uniformity across a wafer.

In an embodiment, the process 980 may continue with operation 982, which comprises adding the device outcomes and other metrology data to the ML model. The additional data added to the ML model may be referred to as a calibration data set. The calibration data set is used to update the ML model so that the ML model more accurately reflects the current condition of the processing tool. For example, the process 980 may include operation 983, which comprises adjusting a model prediction to account for specific chamber conditions. That is, the process space of the ML model is updated to more closely match the conditions of the processing tool being investigated.

In an embodiment, the ML model may be a model of a process space generated from the combination of a statistical model and a physical model. The statistical model may be generated using a DoE of actual wafers as described above. The physical model may be based on real world physics and chemical equations. For example, the physical model may be generated from a simulation of physical and chemical interactions within a processing tool such as the plasma treatment chamber with rotating cross-flows across a plurality of different processing parameters. In an embodiment, the ML model may cover an entire process space available to the processing tool.

In an embodiment, process 980 may continue with operation 984, which comprises predicting optimized process parameters to achieve a desired wafer outcome of wafers subsequently processed in the chamber. The optimized process parameters may be selected after the ML model has been updated to include the calibration data set. Accordingly, the new process recipe provides wafer parameters that result in wafer outcomes that are more closely matched to the targeted values, despite changes to the chamber condition. As such, chamber drift may be monitored and accounted for in order to maintain a tight process window and increase uniformity, repeatability, and yield. Additionally, unscheduled downtime of the tool is reduced since the processing recipe can be accurately adjusted to account for chamber drift. Furthermore, when PM does occur, process 980 may be implemented to provide a shorter recovery time, which improves tool utilization.

In an embodiment, a ML model may further be used to provide continuous (or near continuous) revision of a processing recipe to account for chamber drift. For example, wafer and process data obtained during the processing of device wafers may be obtained and used to update the ML model. That is, a dedicated DoE may not be necessary to provide a calibration data set. Wafer data from device wafers may be obtained for every wafer or for a subset of the wafers being processed.

Such an embodiment, may include providing a ML model of a processing tool. The ML model may include a statistical model and a physical model that is similar to the ML models described above. In an embodiment, the process may begin with a recipe being executed in the processing tool to process a first wafer. After processing the first wafer, wafer data from the first wafer and process data from the processing tool relating to the execution of the recipe may be obtained. In an embodiment, the wafer data may comprise metrology data, such as, but not limited to, a thickness, a thickness uniformity, and a profile. In an embodiment, process data may include data obtained from sensors within processing tool and/or tool configuration information. In an embodiment, the wafer data and the process data are provided to the ML model to generate an updated ML model. In an embodiment, the updated ML model is used to generate a modified recipe to account for chamber drift in the processing tool. Embodiments may then include executing the modified recipe in the processing tool to process a second wafer. While processing of a single first wafer is described above, it is to be appreciated that a plurality of first wafers may be processed before the updated ML model is generated. In such an embodiment, multiple sets of wafer data and process data may be used to generate the updated ML model.

Figure 10:
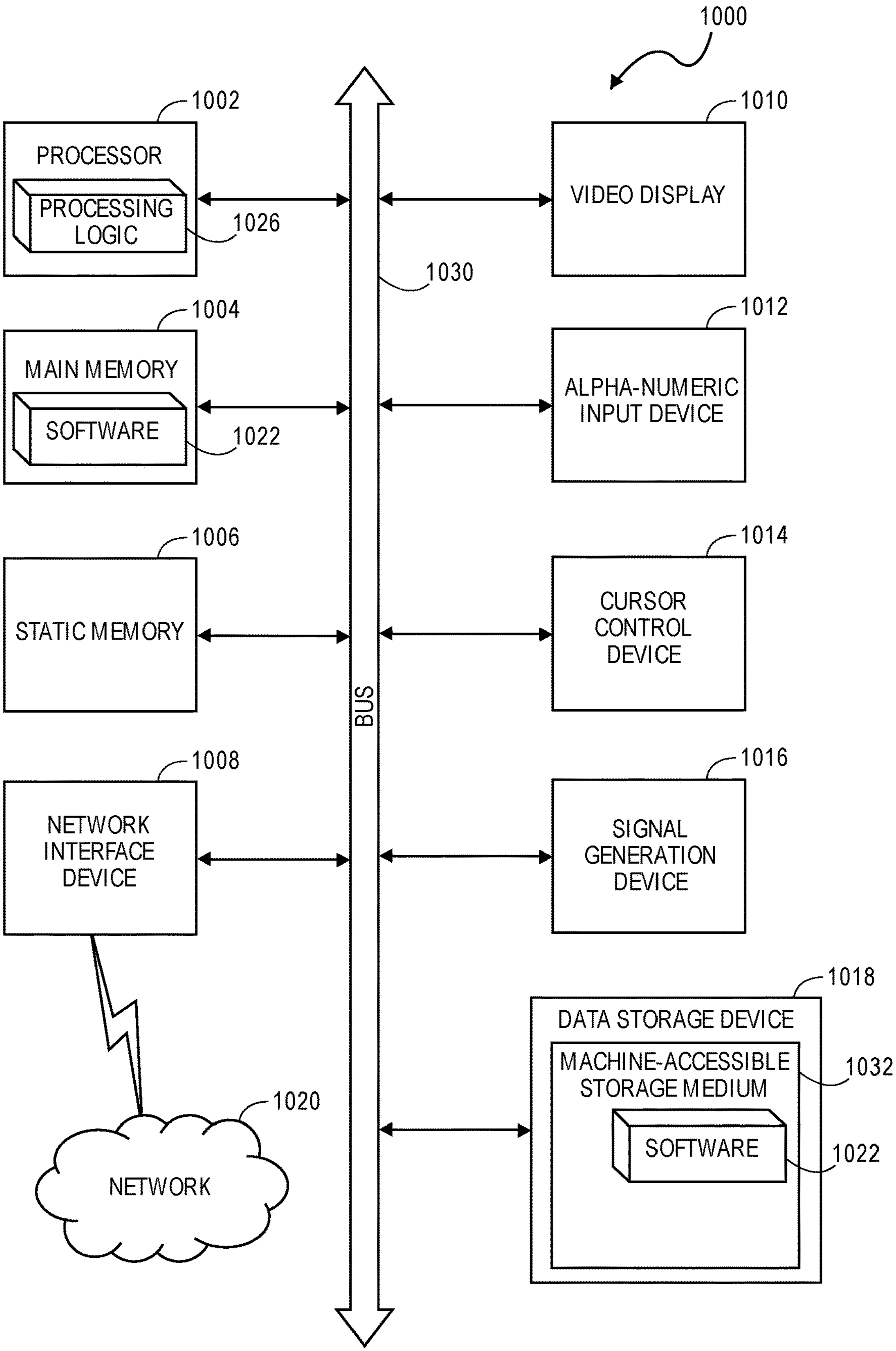
FIG. 10 illustrates a diagrammatic representation of a machine in the exemplary form of a computer system within which a set of instructions, for causing the machine to perform any one or more of the methodologies described herein, may be executed according to an embodiment.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), MRAM, etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of processing a wafer using insight from a ML model and/or a method of updating or building a ML model.

Embodiments of a plasma chamber having a rotating modulated cross-flow have been disclosed.

Example embodiment 1: A plasma treatment chamber, comprising one or more sidewalls. A support surface within the one or more sidewalls holds a workpiece. A first gas injector along the one or more sidewalls injects a first gas flow in a first direction generally parallel to and across a surface of the workpiece. A first pump port along the one or more sidewalls generally opposite of the first gas injector pumps out the first gas flow. A second gas injector along the one or more sidewalls injects a second gas flow in a second direction generally parallel to and across the surface of the workpiece. A second pump port along the one or more sidewalls generally opposite of the second gas injector pumps out the second gas flow. The first gas flow and the second gas flow comprise a process gas mixture, an independent gas injection (IGI) mixture, or both, the process gas mixture and the IGI mixture comprising one or more of an etchant gas or deposition gas, a diluent gas, an oxidizer gas, a reducing gas, a halogen-containing gas, and another gas such as CO or COS.

Example embodiment 2: The plasma treatment chamber of embodiment 1, wherein the plasma treatment chamber is configured to use the first and second gas injectors and the first and second pump ports to rotate the first and second gas flows laterally across the workpiece from the one or more sidewalls to provide a multiphase rotating cross-flow operation, the multiphase rotating cross-flow operation comprising at least a 2-phase cycle.

Example embodiment 3: The plasma treatment chamber of embodiment 1, wherein the one or more sidewalls is cylindrical, oval, square or rectangular in shape.

Example embodiment 4: The plasma treatment chamber of embodiment 1, wherein the first gas injector and the second gas injector are located in openings in the one or more sidewalls.

Example embodiment 5: The plasma treatment chamber of embodiment 4, further comprising: a chamber lid over the one or more sidewalls; a support pedestal that includes the support surface, the support pedestal below the chamber lid and above a chamber floor and surrounded by the one or more sidewalls; and a processing region defined by an area between the chamber lid, the support pedestal, and the one or more sidewalls.

Example embodiment 6: The plasma treatment chamber of embodiment 5, wherein the first gas injector and the second gas injector are located in the one or more sidewalls between the chamber lid and the support pedestal.

Example embodiment 7: The plasma treatment chamber of embodiment 5, wherein locations of the first pump port and the second pump port are vertically offset from locations of the first gas injector and the second gas injector by a distance approximately equal to the distance between a bottom of the chamber lid and the support pedestal.

Example embodiment 8: The plasma treatment chamber of embodiment 5, wherein the first pump port and the second pump port are in cavities between the one or more sidewalls and the support pedestal, and above the chamber floor.

Example embodiment 9: The plasma treatment chamber of embodiment 5, wherein the first pump port and the second pump port are located in additional openings in the one or more sidewalls between the chamber lid and the chamber floor.

Example embodiment 10: The plasma treatment chamber of embodiment 1, wherein the first gas flow and the second gas flow are switched on and off to control gas flow rotation.

Example embodiment 11: The plasma treatment chamber of embodiment 1, further comprising a modulating function applied to a flow rate of at least one of the first and second gas flows or applied to an outlet conductance caused by at least one of the first and second pump ports.

Example embodiment 12: The plasma treatment chamber of embodiment 11, wherein the modulating function comprises one or more gas inlet valves to modulate the flow rate of at least one of the first and second gas flows.

Example embodiment 13: The plasma treatment chamber of embodiment 12, wherein the one or more gas inlet valves are coupled to one or more gas sources such that a single type of gas or a mixture of different types of gases are injected into a processing region during each rotation phase.

Example embodiment 14: The plasma treatment chamber of embodiment 12, wherein the first and second gas injectors apply a constant total gas flow to smoothly and sequentially inject gas flows across different sides of the workpiece in a complete cycle.

Example embodiment 15: The plasma treatment chamber of embodiment 1, further comprising one or more throttle valves to modulate pump port conductance or pressure of at least one of the first and second pump ports.

Example embodiment 16: The plasma treatment chamber of embodiment 15, wherein the one or more throttle valves operate smoothly between two states of conductance or pressure, which are cycled through in a like sequence as the first and second gas injectors.

Example embodiment 17: The plasma treatment chamber of embodiment 1, further comprising a top-down gas flow.

Example embodiment 18: The plasma treatment chamber of embodiment 1, wherein the first gas injector and the first pump port comprise a first injector-pump port pair, and the second gas injector and the second pump port comprise a second gas injector-pump port pair, wherein along a plane generally parallel to an orientation of the workpiece, a location of the first injector-pump port pair is offset by 180° from a location the second injector-pump port pair.

Example embodiment 19: The plasma treatment chamber of embodiment 18, further comprising a top-down gas flow.

Example embodiment 20: The plasma treatment chamber of embodiment 18, wherein the plasma treatment chamber further comprises a third gas injector and an opposing third pump port to provide a third injector-pump port pair and a 3-phase rotating crossflow operation.

Example embodiment 21: The plasma treatment chamber of embodiment 20, wherein the first injector-pump port pair, the second injector-pump port pair and the third injector-pump port pair are offset from one another by 120°.

Example embodiment 22: The plasma treatment chamber of embodiment 20, wherein the first gas injector, the second gas injector, and the third gas injector are located approximately 120° from one another, and the first pump port, the second pump port, and the third pump port are located 120° from one another, wherein the first pump port, the second pump port, and the third pump port are dispersed laterally between the first gas injector, the second gas injector, and the third gas injector.

Example embodiment 23: The plasma treatment chamber of embodiment 20, further comprising a fourth gas injector and an opposing fourth pump port to provide fourth injector-pump port pairs and a 4-phase rotating crossflow operation.

Example embodiment 24: The plasma treatment chamber of embodiment 23, wherein locations of each gas injector-pump port pair along a circular sidewall is offset from adjacent injector-pump port pair locations by an angle equal to 360 total degrees divided by a number of injector-pump port pairs.

Example embodiment 25: The plasma treatment chamber of embodiment 1, wherein at least one of the first gas injector and the second gas injector comprises a single vent in the one or more sidewalls.

Example embodiment 26: The plasma treatment chamber of embodiment 1, wherein the first gas injector and the second gas injector comprises a gas injector array of individual gas injectors.

Example embodiment 27: The plasma treatment chamber of embodiment 26, wherein the individual gas injectors are distributed about a periphery of the one or more sidewalls, wherein sets of the individual gas injectors are modulated by one or more gas inlet valves to create gas flows in various directions across the workpiece.

Example embodiment 28: The plasma treatment chamber of embodiment 1, wherein at least one of the first gas injector and the second gas injector comprises a gas injector array of individual gas injectors.

Example embodiment 29: The plasma treatment chamber of embodiment 28, further comprising a center-to-edge gas flow, wherein at least the first gas flow or the second gas flow injected from center ones of the individual gas injectors in the gas injector array has a greater flow rate relative to edge ones in the gas injector array.

Example embodiment 30: The plasma treatment chamber of embodiment 28, further comprising an edge-to-center gas flow, wherein at least the first gas flow or the second gas flow injected from edge ones of the individual gas injectors in the gas injector array has a greater flow rate relative to center ones in the gas injector array.

Example embodiment 31: The plasma treatment chamber of embodiment 28, further comprising at least four gas injector arrays and opposing pump ports, wherein at least the first gas flow or the second gas flow is directed to the sides of the workpiece rather than across the workpiece by closing an opposing pump port and opening side ones of the pump ports.

Example embodiment 32: The plasma treatment chamber of embodiment 1, wherein the plasma treatment chamber is used to perform reactive ion etching during semiconductor manufacturing.

Example embodiment 33: A method of performing a rotating gas cross-flow in a plasma treatment chamber. During a first phase the steps include, injecting, by a first gas injector, a first gas flow in a first direction generally parallel to and across a surface of a device, and pumping out, by a first pump port, the first gas flow from the plasma treatment chamber, wherein the first gas injector is along one or more sidewalls of the plasma treatment chamber at a first location, and the first pump port is along the one or more sidewalls at a second location generally opposing the first gas injector. During a second phase the steps include, injecting, by a second gas injector, a second gas flow in a second direction generally parallel to and across the surface of the device, and pumping out, by a second pump port, the second gas flow from the plasma treatment chamber, wherein the second gas injector is along the one or more sidewalls at a third location, and the second pump port is along the one or more sidewalls at a fourth location generally opposing the second gas injector. The first gas flow and the second gas flow comprise a process gas mixture, an independent gas injection (IGI) mixture, or both, the process gas mixture and the IGI mixture comprising one or more of an etchant gas or deposition gas, a diluent gas, an oxidizer gas, a reducing gas, a halogen-containing gas, and another gas such as CO or COS.

Example embodiment 34: The method of embodiment 33 further comprising querying a machine learning (ML) model to control timing of the first gas flow and the second gas flow.

Example embodiment 35: The method of embodiment 34 further comprising developing a semiconductor manufacturing process recipe for the device by: selecting one or more device outcomes; and querying the ML model to obtain a process recipe recommendation suitable for obtaining the device outcomes when processed by the plasma treatment chamber with the rotating gas cross-flow.

Example embodiment 36: The method of embodiment 35 further comprising executing a design of experiment (DoE) on a set of wafers to validate the process recipe recommended by the ML model.

Example embodiment 37: The method of embodiment 35 further comprising receiving as the process recipe any combination of: temperature, RF source power, bias power, gas pressure (mTorr), gas flow ramp open times (msec), gas flow time (msec), gas flow ramp closed time (msec), gas flow fraction at various gas injectors, gas composition at various injectors, gas flow fraction going to various injectors, gas flow rotation frequency, gas flow composition frequency, gas flow rate/velocity (pressure gradient), gas flow direction, gas rotation phase, electron/plasma density, plasma density gradient, electron temperature, ion current density, plasma potential, sheath electric field potential, sheath electric field tilt angle, sheath electric field z-component, mass fraction of atomic O, O flux, and ion current density to workpiece.

Example embodiment 38: The method of embodiment 35 further comprising selecting as the device outcomes any combination of: a feature profile, a layer thickness, a thickness uniformity, a material composition of a layer, a composition uniformity, a porosity, a film stress, process uniformity across chambers in a facility, wafer to wafer uniformity, and uniformity between different wafer lots.

Example embodiment 39: The method of embodiment 38 further comprising selecting as the device outcomes during an etch process any combination of: etch rate, etch rate uniformity center-to-edge, etch rate uniformity azimuthal, etch feature uniformity, tilt, bow, and mask remaining.

Example embodiment 40: The method of embodiment 33 further comprising baselining the plasma treatment chamber by running a limited design of experiment (DoE) of wafers with external metrology to baseline chamber performance. Wafer outcomes and metrology data from the limited DoE are added to a ML model as a calibration data set, the ML model comprising a statistical model and a physical model. Adjusting a model prediction to account for specific chamber conditions and/or wafer conditions identified by the limited DoE. Optimized process parameters are predicted to achieve a desired wafer outcome for wafers processed in the plasma treatment chamber.

Example embodiment 41: Embodiments disclosed herein include a plasma treatment chamber, comprising one or more sidewalls. A support within the one or more sidewalls to hold a workpiece. A first gas injector is along the one or more sidewalls at a first location, and a first pump port is along the one or more sidewalls at a second location generally opposing the first gas injector. A second gas injector is along the one or more sidewalls at a third location, and second pump port is along the one or more sidewalls at a fourth location generally opposing the second gas injector. Dual very high frequency (VHF) RF plasma source power generators having VHF-high frequency f1 and VHF-low frequency f2 are coupled to at least one of a top electrode and a bottom electrode, where f1 is sufficiently high to produce a center-high non-uniform plasma ion or electron density or reactive species density distribution over the workpiece, and f2 is sufficiently low to produce a center-low non-uniform plasma ion or electron density or reactive species density distribution; A multiphase rotating cross-flow operation comprises at least a first phase and a second phase. The first phase comprises injecting, by the first gas injector, a first gas flow in a first direction generally parallel to and across a surface of the workpiece, and pumping out, by the first pump port, the first gas flow. The second phase comprises injecting, by the second gas injector, a second gas flow in a second direction generally parallel to and across the surface of the workpiece, and pumping out, by the second pump port, the second gas flow.

Example embodiment 42: The plasma treatment chamber of embodiment 41, further comprising a first gas valve coupled to the first gas injector, a second gas valve coupled to the second gas injector, a first pressure control valve coupled to the first pump port, and a second pressure control valve coupled to the second pump port.

Example embodiment 43: The plasma treatment chamber of embodiment 42, further comprising a controller coupled to the plasma treatment chamber, the controller configured to: during the first phase, start the first gas flow by fully opening the first gas valve and partially opening the second gas valve; and open the first pressure control valve and close the second pressure control valve.

Example embodiment 44: The plasma treatment chamber of embodiment 43, wherein the controller is further configured to: begin to close the first gas valve near a transition between the first phase and the second phase, and rotate a direction of gas flow by fully opening the second gas valve to begin the second phase and partially opening the first gas valve; and open the second pressure control valve and close the first pressure control valve.

Example embodiment 44: A non-transitory computer readable medium having stored thereon software instructions that, when executed by a processor, cause the processor to rotate gas cross-flow in a plasma treatment chamber, by executing the following steps. During a first phase the steps include, injecting, by a first gas injector, a first gas flow in a first direction generally parallel to and across a surface of a device, and pumping out, by a first pump port, the first gas flow from the plasma treatment chamber, wherein the first gas injector is along one or more sidewalls of the plasma treatment chamber at a first location, and the first pump port is along the one or more sidewalls at a second location generally opposing the first gas injector. During a second phase the steps include, injecting, by a second gas injector, a second gas flow in a second direction generally parallel to and across the surface of the device, and pumping out, by a second pump port, the second gas flow from the plasma treatment chamber, wherein the second gas injector is along the one or more sidewalls at a third location, and the second pump port is along the one or more sidewalls at a fourth location generally opposing the second gas injector.

Example embodiment 46. The non-transitory computer readable medium of embodiment 45 further comprising querying a machine learning (ML) models to control timing of the first gas flow and the second gas flow.

Example embodiment 47: The non-transitory computer readable medium of embodiment 46 further comprising developing a semiconductor manufacturing process recipe for the device by: selecting one or more device outcomes; and querying the ML model to obtain a process recipe recommendation suitable for obtaining the device outcomes when processed by the plasma treatment chamber with a rotating gas cross-flow.

Example embodiment 48: The non-transitory computer readable medium of embodiment 47 further comprising executing a design of experiment (DoE) on a set of wafers to validate the process recipe recommended by the ML model.

Example embodiment 49: The non-transitory computer readable medium of embodiment 47 further comprising receiving as the process recipe any combination of: temperature, RF source power, bias power, gas pressure (mTorr), gas flow ramp open times (msec), gas flow time (msec), gas flow ramp closed time (msec), gas flow fraction at various gas injectors, gas composition at various injectors, gas flow fraction going to various injectors, gas flow rotation frequency, gas flow composition frequency, gas flow rate/velocity (pressure gradient), gas flow direction, gas rotation phase, electron/plasma density, plasma density gradient, electron temperature, ion current density, plasma potential, sheath electric field potential, sheath electric field tilt angle, sheath electric field z-component, mass fraction of atomic O, O flux, and ion current density to workpiece.

Example embodiment 50: The non-transitory computer readable medium of embodiment 47 further comprising selecting as the device outcomes any combination of: a feature profile, a layer thickness, a thickness uniformity, a material composition of a layer, a composition uniformity, a porosity, a film stress, process uniformity across chambers in a facility, wafer to wafer uniformity, and uniformity between different wafer lots.

Example embodiment 51: The non-transitory computer readable medium of embodiment 50 further comprising selecting as the device outcomes during an etch process any combination of: etch rate, etch rate uniformity center-to-edge, etch rate uniformity azimuthal, etch feature uniformity, tilt, bow, and mask remaining.

Example embodiment 52: The non-transitory computer readable medium of embodiment 45 further comprising baselining the plasma treatment chamber by running a limited design of experiment (DoE) of wafers with external metrology to baseline chamber performance. Wafer outcomes and metrology data from the limited DoE to a ML model are added as a calibration data set, wherein the ML model comprises a statistical model and a physical model. A model prediction is adjusted to account for specific chamber conditions and/or wafer conditions identified by the limited DoE. Optimized process parameters are predicted to achieve a desired wafer outcome for wafers processed in the plasma treatment chamber.

Example embodiment 53: The plasma treatment chamber of embodiment 1 or 33, further comprising one or more conductance control rings to modulate conductance of the first and second pump ports, the one or more conductance control rings located proximate to first and second plasma screens at a top of the first and second pump ports, respectively.

Example embodiment 54: The plasma treatment chamber of embodiment 53, wherein the one or more conductance control rings comprise a first conductance control ring for the first pump port and a second conductance control ring for the second pump port.

Example embodiment 55: The plasma treatment chamber of embodiment 54, wherein the first and second conductance control rings are independently moved vertically up and down by one or more actuators against the first and second plasma screens to close and open the first and second pump ports.

Example embodiment 56: The plasma treatment chamber of embodiment 55, wherein the first and second conductance control rings are located beneath the first and second plasma screens, and the one or more actuators are located beneath the first and second pump ports.

Example embodiment 57: The plasma treatment chamber of embodiment 55, wherein the first and second conductance control rings are located above the first and second plasma screens in the processing region, and the one or more actuators are located above a chamber lid.

Example embodiment 58: The plasma treatment chamber of embodiment 55, wherein the one or more actuators are coupled to a controller that synchronizes the vertical movement of the first and second conductance control rings to the first gas flow and the second gas flow.

Example embodiment 59: The plasma treatment chamber of embodiment 58, wherein the controller uses a machine learning model to set or control the first gas flow, the second gas flow, and the vertical movement.

Example embodiment 60: The plasma treatment chamber of embodiment 53, wherein the one or more conductance control rings comprises a single conductance control ring for both the first pump port and the second pump port.

Example embodiment 61: The plasma treatment chamber of embodiment 60, wherein the conductance control ring comprises a disc shape having an opening.

Example embodiment 62: The plasma treatment chamber of embodiment 61, wherein the conductance control ring is rotated by one or more actuators so that the opening aligns with and opens a currently active pump port.

Example embodiment 63: The plasma treatment chamber of embodiment 61, wherein the one or more actuators are coupled to a controller that synchronizes the rotational movement of the conductance control ring to the first gas flow and the second gas flow.

Example embodiment 64: The plasma treatment chamber of embodiment 63, wherein the controller uses a machine learning model to set or control the first gas flow and the second gas flow and the rotational position of the conductance control ring.

Example embodiment 65: The plasma treatment chamber of embodiment 61, wherein the conductance control ring has an outside diameter approximately matching an outside diameter of the processing region and inside diameter approximately matching the diameter of the pedestal.

Example embodiment 66: The plasma treatment chamber of embodiment 61, wherein the conductance control ring is located directly below and abutting the first and second plasma screens.

Example embodiment 67: The plasma treatment chamber of embodiment 61, wherein the conductance control ring is located above and directly on the first and second plasma screens.

What is claimed is:

1. A plasma treatment chamber, comprising:

one or more sidewalls comprising an outer sidewall and an inner sidewall;

a support within the one or more sidewalls to hold a workpiece;

one or more gas inlet valves coupled to respective sets of gas lines;

a first gas injector along the one or more sidewalls at a first location;

a first pump port along the one or more sidewalls at a second location generally opposing the first gas injector;

a first plasma screen located on top of the first pump port;

a second gas injector along the one or more sidewalls at a third location;

a second pump port along the one or more sidewalls at a fourth location generally opposing the second gas injector;

a second plasma screen located on top of the second pump port;

a third gas injector along the one or more sidewalls at a fifth location;

a third pump port along the one or more sidewalls at a sixth location generally opposing the third gas injector;

a conductance control ring to modulate conductance of the first and second pump ports, the conductance control ring located proximate to the first and second plasma screens at a top of the first and second pump ports, respectively, the conductance control ring comprising a disc shape having a single opening that is sized to cover both the top of the first pump ports and the top of second pump port, wherein rotation of the conductance control ring selectively aligns the single opening with one of the first or second pump ports; and a memory storing one or more machine learning (ML) models;

one or more sensors implemented in the plasma treatment chamber to monitor real-time chamber conditions;

a controller configured to control the plasma treatment chamber using a multiphase rotating cross-flow operation, the controller configured to control the gas inlet valves and conductance control ring by using the one or more ML models to control timing of the first gas flow and the second gas flow and individually controllable processing parameters, including: total gas flow mixture, gas pressure, gas flow ramp open times, gas flow time, and gas flow ramp closed times, the multiphase rotating cross-flow operation, comprising at least:

a first phase comprising injecting, by the first gas injector, a first gas flow through the inner sidewall in a first direction generally parallel to and across a surface of the workpiece, and pumping out, by the first pump port, the first gas flow;

a second phase comprising injecting, by the second gas injector, a second gas flow the inner sidewall in a second direction generally parallel to and across the surface of the workpiece, and pumping out, by the second pump port, the second gas flow, wherein the second direction is different than the first direction; and a third phase comprising injecting, by the third gas injector, a third gas flow through the inner sidewall in a third direction generally parallel to and across the surface of the workpiece, and pumping out, by the third pump port, the third gas flow, wherein the third direction is different than the first direction and the second direction, and wherein the first gas flow and the second gas flow are injected without a top-down gas flow on the workpiece;

cause the one or more ML models to be updated by:

collecting a data set of the real-time chamber conditions from the one or more sensors during processing;

using the data set to update the one or more ML models to identify a physical drift of the plasma treatment chamber;

predicting optimized process parameters via the updated one or more ML models to account for the identified physical drift; and dynamically modifying an execution of a subsequent phase of the multiphase rotating cross-flow operation using the predicted optimized process parameters to maintain processing uniformity.

2. The plasma treatment chamber of claim 1, wherein the conductance control ring is rotated by one or more actuators so that the opening aligns with and opens a currently active pump port.

3. The plasma treatment chamber of claim 1, wherein the one or more actuators are coupled to the controller that synchronizes the rotational movement of the conductance control ring to the first gas flow and the second gas flow.

4. The plasma treatment chamber of claim 1, wherein the conductance control ring has an outside diameter approximately matching an outside diameter of the processing region and inside diameter approximately matching the diameter of the pedestal.

5. The plasma treatment chamber of claim 1, wherein the conductance control ring is located above and directly on the first and second plasma screens.

6. The plasma treatment chamber of claim 1, wherein the first gas injector, the second gas injector, and the third gas injector are symmetrically arranged about the central axis of the plasma treatment chamber, and the first pump port, the second pump port, and the third pump port are symmetrically arranged about the central axis of the plasma treatment chamber.

7. The plasma treatment chamber of claim 1, wherein the first gas injector, the second gas injector, and the third gas injector are located approximately 120° from one another, and the first pump port, the second pump port, and the third pump port are located 120° from one another, wherein the first pump port, the second pump port, and the third pump port are dispersed laterally between the first gas injector, the second gas injector, and the third gas injector.

8. The plasma treatment chamber of claim 1, further comprising a fourth gas injector and an opposing fourth pump port to provide four injector-pump port pairs and a 4-phase rotating crossflow operation.

9. The plasma treatment chamber of claim 1, wherein locations of each gas injector-pump port pair along a circular sidewall is offset from adjacent injector-pump port pair locations by an angle equal to 360 total degrees divided by a number of injector-pump port pairs.

10. The plasma treatment chamber of claim 1, wherein the controller is further configured to customize the first gas flow and the second gas flow injected by plasma treatment chamber to control both etch depth uniformity and aspect ratio (depth-to-width) uniformity of openings formed in material layers on the workpiece, wherein the openings are etched to have a first aspect ratio through the material layers and a second aspect ratio through an alternating layer stack.

11. The plasma treatment chamber of claim 10, wherein the openings in the workpiece have a varying aspect ratio through the alternating layer stack and the openings are etched to have aspect ratios greater than 8:1.

* * * * *